(12) United States Patent
Koike et al.

(10) Patent No.: US 8,362,626 B2
(45) Date of Patent: Jan. 29, 2013

(54) SEMICONDUCTOR DEVICE WITH NON-OVERLAPPED CIRCUITS

(75) Inventors: Nobuya Koike, Tokyo (JP); Shinya Nagata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 525 days.

(21) Appl. No.: 12/197,938

(22) Filed: Aug. 25, 2008

(65) Prior Publication Data

US 2009/0057915 A1 Mar. 5, 2009

(30) Foreign Application Priority Data

Aug. 28, 2007 (JP) ................. 2007-221199

(51) Int. Cl.
*H01L 23/34* (2006.01)

(52) U.S. Cl. ........ 257/777; 257/686; 257/690; 257/724; 257/E23.01; 257/E25.023

(58) Field of Classification Search .................. 257/777, 257/690, 686, E23.01, 724, E25.023
See application file for complete search history.

(56) References Cited

U.S. PATENT DOCUMENTS

| | | | | |
|---|---|---|---|---|
| 4,947,234 A | * | 8/1990 | Einzinger et al. | 257/500 |
| 5,644,167 A | * | 7/1997 | Weiler et al. | 257/777 |
| 6,458,609 B1 | | 10/2002 | Hikita et al. | |
| 6,472,747 B2 | * | 10/2002 | Bazarjani et al. | 257/724 |
| 6,849,933 B2 | * | 2/2005 | Koike et al. | 257/676 |
| 7,462,929 B2 | * | 12/2008 | Hiranuma et al. | 257/686 |
| 2004/0188854 A1 | * | 9/2004 | Konishi et al. | 257/777 |
| 2004/0262775 A1 | * | 12/2004 | Ohie | 257/777 |
| 2005/0127526 A1 | * | 6/2005 | Saeki et al. | 257/777 |
| 2006/0214616 A1 | * | 9/2006 | Shen et al. | 318/439 |
| 2006/0220673 A1 | * | 10/2006 | Hiranuma et al. | 326/27 |

FOREIGN PATENT DOCUMENTS

| | | |
|---|---|---|
| JP | 2566207 B2 | 10/1996 |
| JP | 11-163256 A | 6/1999 |
| JP | 2003-031736 A | 1/2003 |

* cited by examiner

*Primary Examiner* — N Drew Richards
*Assistant Examiner* — John P Dulka
(74) *Attorney, Agent, or Firm* — Miles and Stockbridge P.C.

(57) ABSTRACT

An SiP (semiconductor device) using a stacked packaging method for stacking a microcomputer IC chip over a driver IC chip in which circuits sensitive to heat or noise, including an analog to digital conversion circuit, a digital to analog conversion circuit, a sense amplifier circuit of a memory (RAM or ROM), or a power supply circuit of a microcomputer IC chip, are prevented from two-dimensionally overlapping with a driver circuit of the lower-side driver IC chip to reduce, during the operation, the effect of heat or noise, which the circuits sensitive to heat or noise of the microcomputer IC chip receive from the driver circuit of the lower-side driver IC chip, thereby improving the operation stability of the SiP (semiconductor device) using the stacked packaging method.

16 Claims, 14 Drawing Sheets

SEMICONDUCTOR DEVICE WITH NON-OVERLAPPED CIRCUITS

CROSS-REFERENCE TO RELATED APPLICATION

The present application claims priority from Japanese patent application No. 2007-221199 filed on Aug. 28, 2007, the content of which is hereby incorporated by reference into this application.

BACKGROUND OF THE INVENTION

The present invention relates to semiconductor device techniques, and in particular, relates to a technique effectively applied to a SiP (System in Package), in which a first semiconductor chip including an amplifier and a second semiconductor chip including a control circuit for controlling the operation of this amplifier are mixedly mounted inside a single sealing body to configure a desired circuit function.

The SiP is an approach for configuring a desired circuit function inside a single sealing body by sealing a plurality of semiconductor chips inside the single sealing body. In the case of SiP, since already developed semiconductor chips can be directly applied, the development time can be reduced as compared with SOC (System On Chip) and furthermore the development cost can be suppressed. Moreover, in the case of SOC, wide variety of memories are difficult to be mixedly mounted inside a single semiconductor chip, while in the case of SiP, wide variety of large capacity memories can be mixedly mounted with ease. Moreover, in the case of SiP, the wiring length can be shortened as compared with the case where a plurality of packages is mounted on a wiring board to configure a desired circuit function, and it is therefore possible to promote higher speed and higher performance of the whole semiconductor device.

Such a SiP is described in Japanese Patent No. 2566207 (Patent Document 1), for example. Here, there is disclosed a structure, in which a semiconductor substrate including a power MOSFET and a semiconductor substrate including a control circuit for controlling the operation of this power MOSFET are stacked in this order from the lower layer over a cooling body. A sensor for detecting the temperature caused by the operation of the lower-side power MOSFET is arranged in the upper-side semiconductor substrate including the control circuit so that the power MOSFET may be turned off by the operation of this sensor.

Moreover, for example, Japanese Unexamined Patent Publication No. 2003-31736 (Patent Document 2) discloses a structure, in which the rear surface of a heat spreader mounting a semiconductor chip is exposed from a resin body.

Moreover, for example, Japanese Unexamined Patent Publication No. 11-163256 (Patent Document 3) discloses a structure, in which the rear surface side of either of two semiconductor chips stacked with their mutual major surfaces facing each other is exposed from a packaging resin.

SUMMARY OF THE INVENTION

Incidentally, as one type of SiP, there is proposed a structure, in which a semiconductor chip including an amplifier and a semiconductor chip including a control circuit for controlling the operation of this amplifier are mixedly mounted inside a single sealing body.

As a method for having these two semiconductor chips mixedly mounted, two semiconductor chips may be mounted in a planar manner over one die pad. However, in this case, a demand for miniaturization of the semiconductor device cannot be met sufficiently and in addition the wire connection between the semiconductor chip and a lead (or a wiring board) or the wire connection between two semiconductor chips becomes difficult.

Then, as disclosed in Patent Document 1, two semiconductor chips may be stacked. However, the semiconductor chip including an amplifier, since it handles higher power than the semiconductor chip including a control circuit, tends to generate heat and under the influence of this heat the operation of the upper-side semiconductor chip including a control circuit becomes unstable.

Then, in order to improve the radiation characteristic of the heat generated in the semiconductor chip including an amplifier, there is a method for mounting the semiconductor chip including an amplifier on a heat sink, as disclosed in Patent Documents 2 and 3. However, just an application of the heat sink cannot be a sufficient countermeasure, and there remains a problem that the operation of the semiconductor chip including a control circuit is not stabilized.

It is an object of the present invention to provide a technique capable of improving the operation stability of a semiconductor device having a structure, in which a semiconductor chip including an amplifier and a semiconductor chip including a control circuit for controlling the operation of this amplifier are mixedly mounted with these chips being stacked inside a single sealing body.

The above-described and other objects and novel features of the present invention will be apparent from the description and accompanying drawings of the present specification.

The outline of an embodiment among a plurality of inventions disclosed in the present application will be briefly described as follows.

Namely, the present embodiment has a structure, in which a second semiconductor chip is mounted over a first semiconductor chip mounted over a chip mounting part, and these first and second semiconductor chips are sealed with a sealing body, wherein the second semiconductor chip is mounted over the first semiconductor chip so that a circuit sensitive to noise of the second semiconductor chip may not two-dimensionally overlap with an amplifier of the first semiconductor chip.

The advantage obtained by the representative invention among the present inventions disclosed in the present application will be described briefly as follows.

That is, by mounting the second semiconductor chip over the first semiconductor chip so that a circuit sensitive to noise of the second semiconductor chip may not two-dimensionally overlap with an amplifier of the first semiconductor chip, it is possible to improve the operation stability of a semiconductor device having a structure, in which a semiconductor chip including an amplifier and a semiconductor chip including a control circuit for controlling the operation of this amplifier are mixedly mounted with these chips being stacked inside a single sealing body.

DETAILED DESCRIPTION OF THE PREFERRED EMBODIMENTS

Figure 1:
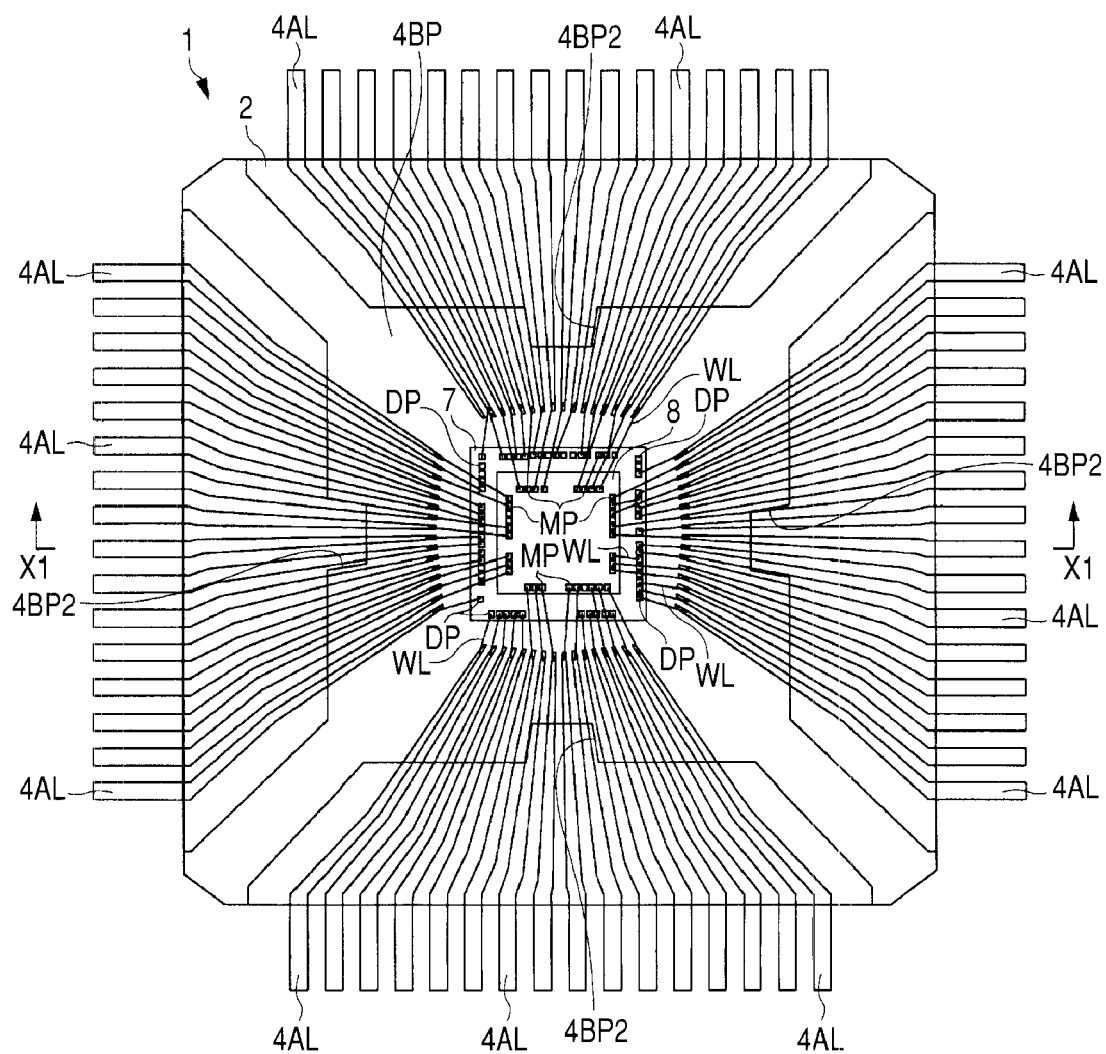
FIG. 1 is a plan view of a semiconductor device as an embodiment of the present invention.

In the following embodiments, the number or the like of elements (including the number of articles, the values, the amounts, the ranges, or the like) to be referred to below is not limited to any specific number unless otherwise specifically stated and unless otherwise apparently limited to a specific number in principle, and it may be not less than or not more than the specific number. Furthermore, in the following embodiments, it is not to mention that the constituent elements (including element steps) are not always indispensable unless otherwise specifically stated and unless otherwise apparently considered to be indispensable in principle. In the same way, in the following embodiments, shapes, positions, or the like of the constituent elements to be referred to below include those approximate or similar to the actual shapes or the like unless otherwise specifically stated and unless otherwise apparently considered not to be so in principle. This is also true for the values and ranges described above. In addition, in all the accompanying drawings for describing the embodiments of the present invention, the same reference numerals and symbols will be given to the elements having the same functions to avoid the redundant description as much as possible.

Note that, in the following description, a semiconductor chip in which a microcomputer (control circuit) is formed is referred to as a microcomputer IC chip, and a semiconductor chip in which a driver circuit (amplifier) whose operation is controlled by the microcomputer IC chip is formed is referred to as a driver IC chip.

First, a semiconductor device the inventors studied will be described.

The semiconductor device the inventor studied is a semiconductor device in the automotive field, for example. In the semiconductor devices used in the automotive field, a microcomputer (control) IC chip and a driver IC chip have been separately packaged, respectively, however, with the increasing demand for miniaturization and higher efficiency in semiconductor devices used in the automotive field in recent years, the microcomputer IC chip and the driver IC chip need to be incorporated in the same package (sealing body).

Figure 21:
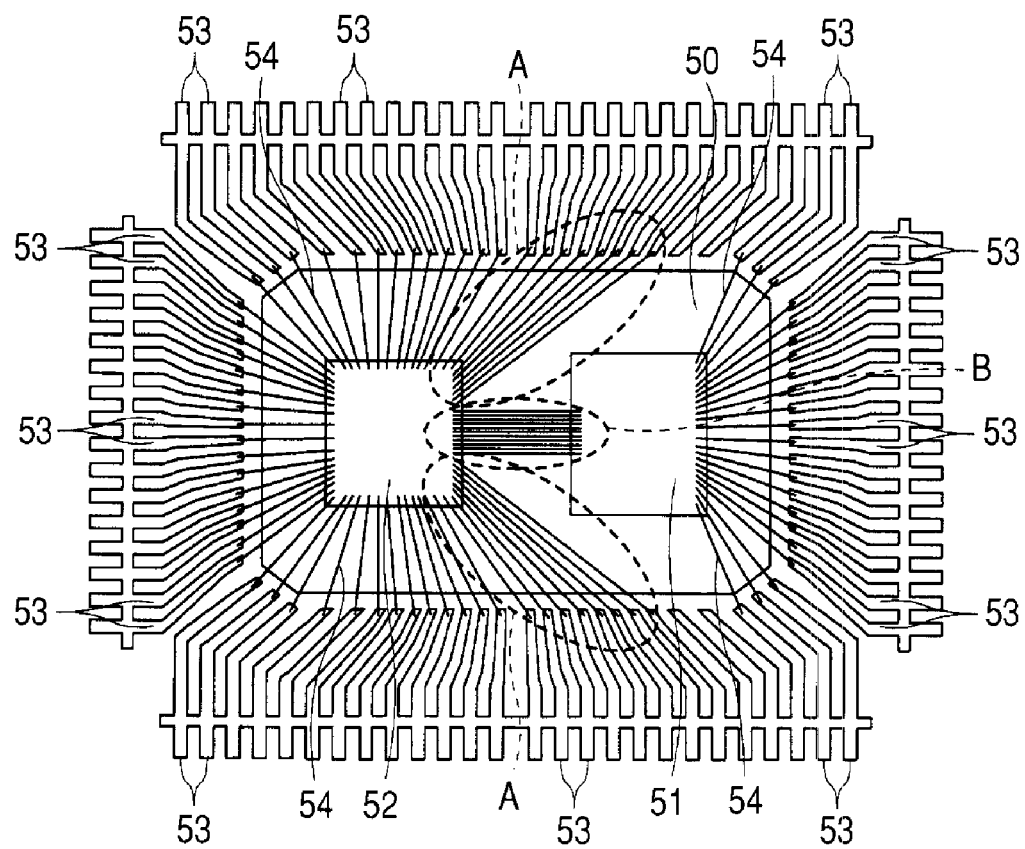
FIG. 21 is a plan view of a semiconductor device the inventors studied.
Figure 22:
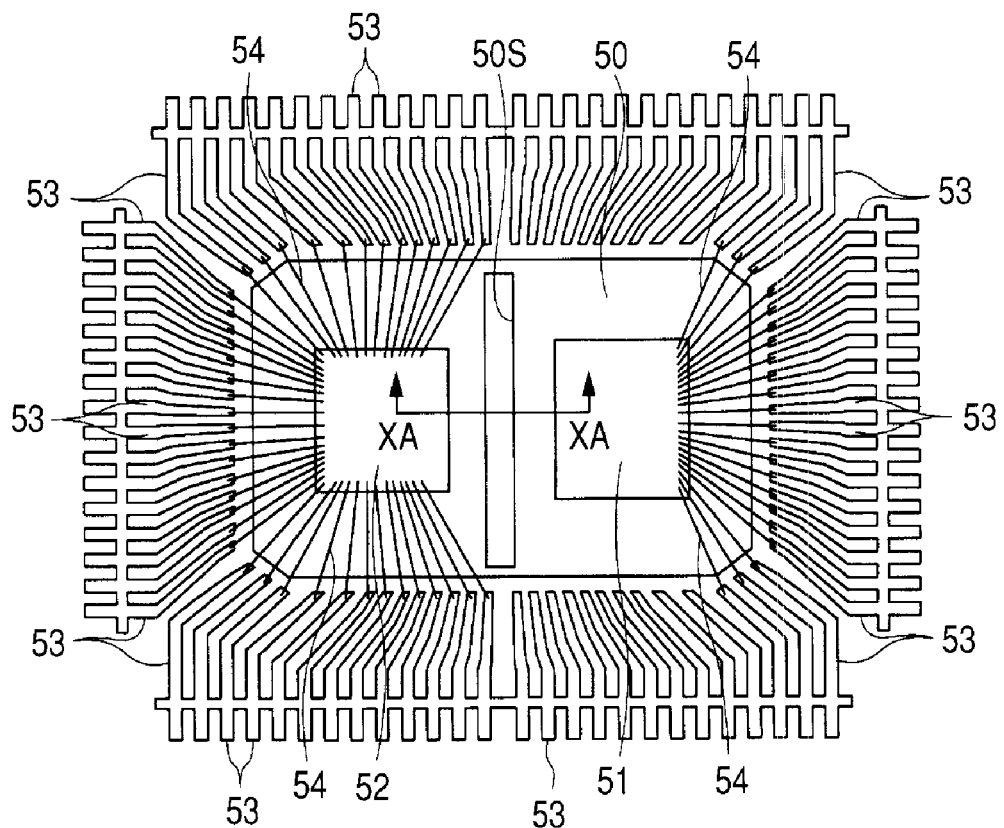
FIG. 22 is a plan view of the semiconductor device the inventors studied.
Figure 23:
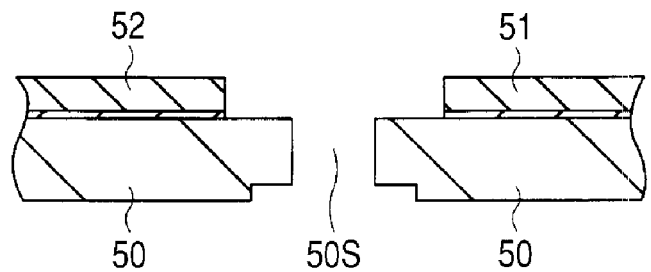
FIG. 23 is a cross sectional view along an XA-XA line of FIG. 22.

FIG. 21 and FIG. 22 are plan views of the semiconductor device used in the automotive field the inventors studied, and FIG. 23 is a cross sectional view along an XA-XA line of FIG. 22. Note that, in FIG. 21 and FIG. 22, the package is not illustrated for ease of viewing the drawings. Moreover, in FIG. 22, some of bonding wires (hereinafter, refers to as wires) of FIG. 21 are not illustrated for ease of viewing the drawing.

Over a die pad 50, a microcomputer IC chip 51 and a driver IC chip 52 are arranged side by side in a planar manner (plane-type mounting method). Since the driver IC chip 52 includes a power MOSFET (Metal Oxide Semiconductor Field Effect Transistor) and the heat generation amount during the operation is high, the microcomputer IC chip 51 and the driver IC chip 52 are usually arranged in a planar manner for incorporating the microcomputer IC chip 51 and the driver IC chip 52 in the same package. However, this requires an area for mounting the two semiconductor chips of the microcomputer IC chip 51 and driver IC chip 52 and has a problem that the demand for miniaturization of the semiconductor device cannot be met sufficiently.

Moreover, as illustrated in FIG. 22 and FIG. 23, a slit 50S is formed between the microcomputer IC chip 51 and the driver IC chip 52 in the die pad 50. This is for preventing the heat generated in the driver IC chip 52 from being conducted to the microcomputer IC chip 51. Although this thermal diffusion-preventing slit 50S disconnects a heat radiation path between the microcomputer IC chip 51 and the driver IC chip 52, the area of the die pad 50 will increase by the amount that this slit 50S is formed and therefore the miniaturization of the semiconductor device is hampered further.

A plurality of leads 53 is arranged around the microcomputer IC chip 51 and the driver IC chip 52. The microcomputer IC chip 51 and the driver IC chip 52 are electrically coupled to the leads 53 via wires 54, respectively. However, in arranging the microcomputer IC chip 51 and the driver IC chip 52 in a planar manner, the layout of the wires 54 is partially limited.

For example, among the wires 54 for electrically coupling the driver IC chip 52 to the leads 53, there are some wires, the length of which becomes extremely long, like the wires 54 enclosed with a dashed line A of FIG. 21.

Moreover, for example, the arrangement position of the wires 54 electrically coupling the microcomputer IC chip 51 to the driver IC chip 52 is limited to the opposing sides of the microcomputer IC chip 51 and the driver IC chip 52, as shown by a dashed line B of FIG. 21.

Then, as an approach of incorporating the microcomputer IC chip 51 and the driver IC chip 52 in the same package, a stacked packaging method for stacking the microcomputer IC chip 51 and the driver IC chip 52 in the thickness direction thereof can be contemplated.

However, since the driver IC chip 52 includes a power MOSFET and handles a higher electric current (high voltage) than the microcomputer IC chip 51, the heat generation amount during the operation is large and the driver IC chip 52 is likely to generate heat. For this reason, when the stacked packaging method is employed, the operation of the microcomputer IC chip becomes unstable under an influence of the heat generated by the driver IC chip 52.

Then, in order to improve the radiation characteristic of the heat generated in the driver IC chip 52, there is a method for mounting the driver IC chip 52 with the driver IC chip 52 being in contact with a heat sink (die pad). However, just the application of the heat sink cannot be a sufficient countermeasure and there remains a problem that the operation of the microcomputer IC chip 51 is not stabilized.

Moreover, a noise generated in the driver IC chip 52 may affect the microcomputer IC chip 51.

Next, a semiconductor device of the present embodiment will be described in detail based on the accompanying drawings.

Figure 2:
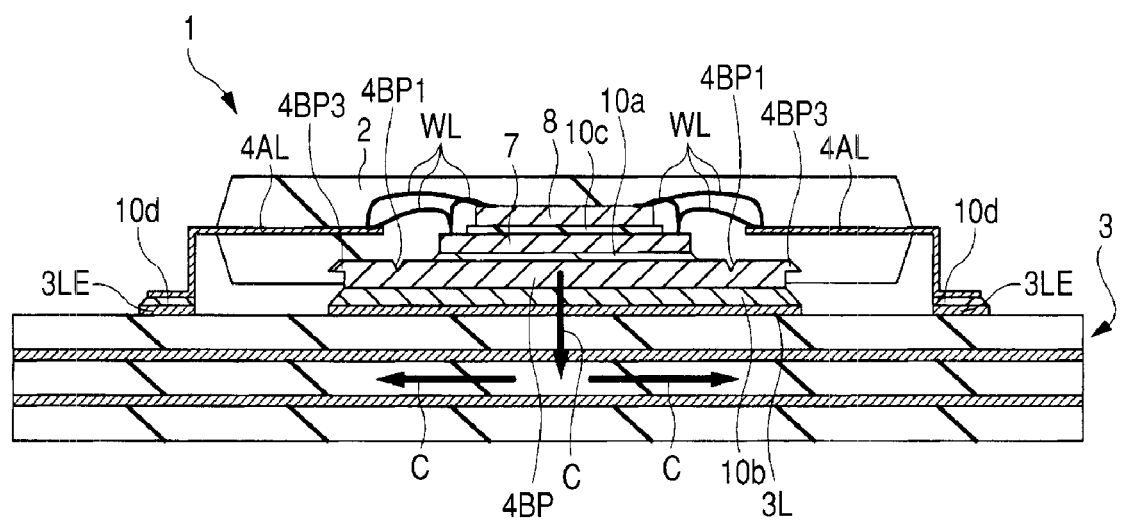
FIG. 2 is a cross sectional view of a portion corresponding to an X1-X1 line of FIG. 1.

FIG. 1 is a plan view of a semiconductor device 1 of the present embodiment, and FIG. 2 is a cross sectional view of a portion corresponding to an X1-X1 line of FIG. 1. Note that, in FIG. 1, the interior of a package (sealing body) 2 is seen through so that the internal construction of the semiconductor device 1 may be observed. Moreover, FIG. 2 exemplifies how the semiconductor device 1 of FIG. 1 is mounted over a wiring board 3.

The semiconductor device 1 of the present embodiment is a power SiP (System in Package) for automotive use, for example. Here, as the structure of the package 2, for example, a QFP (Quad Flat Package) structure in which a plurality of leads 4AL projects from four side surfaces of the package 2 is shown.

However, the construction of the package 2 is not limited to this but various modifications are possible, and an SOP (Small Outline Package) structure in which a plurality of leads 4AL projects from two opposing side surfaces of the package 2 may be employed. Moreover, for example, a QFN (Quad Flat Non leaded Package) structure including a plurality of flat electrode pads on four side surfaces of the package 2 (or on the rear surface in the vicinity of four side surfaces) maybe employed, or, for example, an SON (Small Outline Non leaded Package) structure including a plurality of flat electrode pads on two opposing side surfaces of the package 2 (or on the rear surface in the vicinity of the two side surfaces) may be employed.

The method for packaging semiconductor chips constituting the semiconductor device 1 is the so-called stacked packaging method, in which a driver IC chip (a first semiconductor chip) 7 and a microcomputer IC chip (a second semiconductor chip) 8 are stacked in this order from the lower layer over the major surface of a die pad (chip mounting part) 4BP. Since this makes the plane area of the semiconductor device 1 smaller than the above-described plain type packaging method, the semiconductor device 1 can be miniaturized.

The driver IC chip 7 has a major surface (a first major surface) and a rear surface (a second major surface) positioned on the opposite sides to each other along the thickness direction. In the major surface of this driver IC chip 7, for example, the so-called mixed signal (Mixed Signal: MSIG) IC wherein a digital circuit and an analog circuit are mixed in the same semiconductor chip is formed. This driver IC chip 7 is also an application specific integrated circuit (ASIC), for example. The detail of this circuit will be described later.

Moreover, in the vicinity of the periphery in the major surface of the driver IC chip 7, a plurality of bonding pads (external terminals) DP are formed along this periphery (hereinafter, the bonding pad is referred to as the pad). The pads DP are the extraction electrodes for the MSIG IC in the major surface of the driver IC chip 7.

A driver circuit (amplifier circuit) in the MSIG IC is a circuit for driving, for example, a solenoid, a stepping motor, or an electronic device such as a power MOSFET (external load of the semiconductor device 1). Since this driver circuit includes a power MOSFET, the driving current (or driving voltage) thereof is higher than the driving current (or driving voltage) of a circuit in the microcomputer IC chip 8 and thus is likely to generate heat. Namely, the heat generation amount during the driving of the driver IC chip 7 is higher than that during the driving of the microcomputer IC chip 8. The heat generation amount of the driver IC chip 7 is around several watts (e.g., 1 to 10 W).

This driver IC chip 7 is mounted in the center of a major surface of the die pad 4BP. The die pad 4BP has the major surface (a first major surface) and a rear surface (a second major surface) positioned on the opposite sides to each other along the thickness direction. The rear surface of the driver IC chip 7 is bonded to the major surface of the die pad 4BP via an adhesive layer 10a. The adhesive layer 10a is formed of, for example, a metal such as a lead (Pb)-tin (Sn) solder having a low thermal resistance.

The die pad 4BP also has a function as a heat sink for radiating the heat generated in the driver IC chip 7. For this reason, the die pad 4BP is formed of, for example, a metal, such as copper (Cu) or a copper alloy, having a high thermal conductivity. Moreover, in order to increase the heat radiation area, the plane area of the die pad 4BP is formed larger than that of the driver IC chip 7.

The rear surface of the die pad 4BP is exposed from the rear surface (the surface opposite to the major surface of the wiring board 3: i.e., the mounting surface) of the package 2. Furthermore, the rear surface of the die pad 4BP is bonded to a land pattern 3L of the wiring board 3 via an adhesive layer 10b. The adhesive layer 10b is formed of, for example, a lead free solder such as a tin-silver (Ag)-copper alloy. The land pattern 3L is composed of copper or a copper alloy, for example, and the exposed surface thereof is given gold plating with a nickel underlayer, for example.

Accordingly, the heat generated in the driver IC chip 7 is radiated to the wiring board 3 through the adhesive layer 10a, the die pad 4BP, and the adhesive layer 10b, in this order, as shown with an arrow C of FIG. 2.

In this way, in the present embodiment, by arranging the driver IC chip 7 having a large heat generation amount at the lower side near the die pad 4BP, it is possible to improve the radiation characteristic of the heat generated in the driver IC chip 7.

Moreover, in the present embodiment, by using a material having a low thermal resistance as the materials of the adhesive layer 10a and the die pad 4BP positioned along the heat radiation path of the driver IC chip 7, it is possible to improve the radiation characteristic of the heat generated in the driver IC chip 7.

Furthermore, in the present embodiment, by exposing the rear surface of the die pad 4BP from the rear surface (mounting surface) of the package 2, it is possible to radiate the heat generated in the driver IC chip 7 to the outside of the package 2. Moreover, by bonding the rear surface of the die pad 4BP to the land pattern 3L of the wiring board 3 via the adhesive layer 10b, it is possible to release the heat generated in the driver IC chip 7 to the wiring board 3 side.

These can improve the stability of the entire circuit operation of the semiconductor device 1. Moreover, since the applied voltage can be increased further, high output products can be provided.

Note that a recess 4BP1 of the major surface of the die pad 4BP, a recess 4BP2 of the side surface of the die pad 4BP, and a projecting portion 4BP3 of the side surface of the die pad 4BP are constituting elements for improving the adhesiveness between the package 2 and the large die pad 4BP.

The microcomputer IC chip 8 has the major surface (a first major surface) and the rear surface (a second major surface) positioned on the opposite sides to each other along the thickness direction. Circuits for controlling the operation of the circuit (the above-described driver circuit and other circuits) of the driver IC chip 7 are formed in the major surface of this microcomputer IC chip 8. The detail of this circuit will be described later.

Moreover, in the vicinity of the periphery in the major surface of the microcomputer IC chip 8, a plurality of pads (external terminals) MP is formed along this periphery. The pads MP are extraction electrodes for the circuits in the major surface of the microcomputer IC chip 8.

This microcomputer IC chip 8 is mounted in the major surface of the driver IC chip 7. The rear surface of the microcomputer IC chip 8 is bonded to the major surface of the driver IC chip 7 via an adhesive layer 10c. The adhesive layer 10c is formed of an insulating paste material or an insulating film (sheet), for example. In this way, by forming the adhesive layer 10c of a material having a low thermal conductivity (material having a high thermal resistance), the heat generated in the driver IC chip 7 can be suppressed from being conducted to the microcomputer IC chip 8. Moreover, the tilt of the microcomputer IC chip 8 can be controlled by forming the adhesive layer 10c of a material having flexibility.

The pads DP of the driver IC chip 7 and the pads MP of the microcomputer IC chip 8 are electrically directly coupled to each other via the wires WL and are also electrically coupled to the plurality of leads 4AL. The wire WL is formed of gold or aluminum (Al), for example.

In the present embodiment, since the microcomputer IC chip 8 can be stacked over the driver IC chip 7, it is possible to eliminate such restrictions in terms of the layout of the wires WL that some of the wires WL become extremely long or that the arrangement area of some of the wires WL are limited. Accordingly, the circuit design of the semiconductor device 1 can be performed easily. Moreover, the yield and reliability of the semiconductor device 1 can be improved.

The leads 4AL are formed of, for example, copper or a copper alloy, and are arranged side by side so as to surround the periphery of a layered product of the driver IC chip 7 and microcomputer IC chip 8. The tips of these leads 4AL on the side of driver IC chip 7 and on the microcomputer IC chip 8 overlap with a part of the die pad 4BP when seen from a plan view but these are separated and isolated from each other when seen from a cross sectional view.

The entire driver IC chip 7, the entire microcomputer IC chip 8, the entire wires WL, a part of the die pad 4BP, and a part of the plurality of leads 4AL are covered and sealed with the package 2.

This package 2 is formed with, for example, a plastic material such as an epoxy-based resin being as the base material. A part of the plurality of leads 4AL is projected (exposed) from the four side surfaces of this package 2. In this lead 4AL, a portion covered with the package 2 is referred to as an inner lead portion and a portion exposed from the package 2 is referred to as an outer lead portion.

The outer lead portion of the lead 4AL is formed in a gull wing shape, for example. The mounting surface (surface facing the land pattern 3LE in the major surface of the wiring board 3) of the outer lead portion of the lead 4AL is bonded to the land pattern 3LE via an adhesive layer 10d. The adhesive layer 10d is formed of, for example, the same lead-free solder as in the adhesive layer 10b.

Here, the height of the mounting surface (mounting surface of the die pad 4BP) of the package 2 is preferably the same as or higher than the height of the mounting surface of the lead 4AL. The heights referred to here are the distances from the major surface of the wiring board 3 to the mounting surface of the package 2 and to the mounting surface of the plurality of leads 4AL.

This is because if the height of the mounting surface (mounting surface of the die pad 4BP) of the package 2 is made lower than that of the mounting surface of the lead 4AL, then the mounting surface of the die pad 4BP and the land pattern 3L of the wiring board 3 are bonded to each other but the mounting surface of the outer lead portion of the lead 4AL and the land pattern 3LE of the wiring board 3 will not be bonded to each other.

In the present embodiment, the height of the mounting surface (mounting surface of the die pad 4BP) of the package 2 is higher than that of the mounting surface of the lead 4AL. Accordingly, the mounting surface of the outer lead portion of the plurality of leads 4AL and the land pattern 3LE of the wiring board 3 can be excellently bonded to each other and can be electrically excellently coupled to each other. However, in this case, in order to excellently bond the mounting surface of the die pad 4BP and the land pattern 3L of the wiring board 3 to each other, the thickness of the adhesive layer 10b for bonding the die pad 4BP to the land pattern 3L is thicker than that of the adhesive layer 10b for bonding the lead 4AL to the land pattern 3LE.

The height of the mounting surface (mounting surface of the die pad 4BP) of the package 2 may be the same as the height of the mounting surface of the lead 4AL. Also in this case, the same advantage as the above can be obtained. However, in this case, the thickness of the adhesive layer 10b for bonding the die pad 4BP to the land pattern 3L is made the same as that of the adhesive layer 10d for bonding the lead 4AL to the land pattern 3LE.

Figure 3:
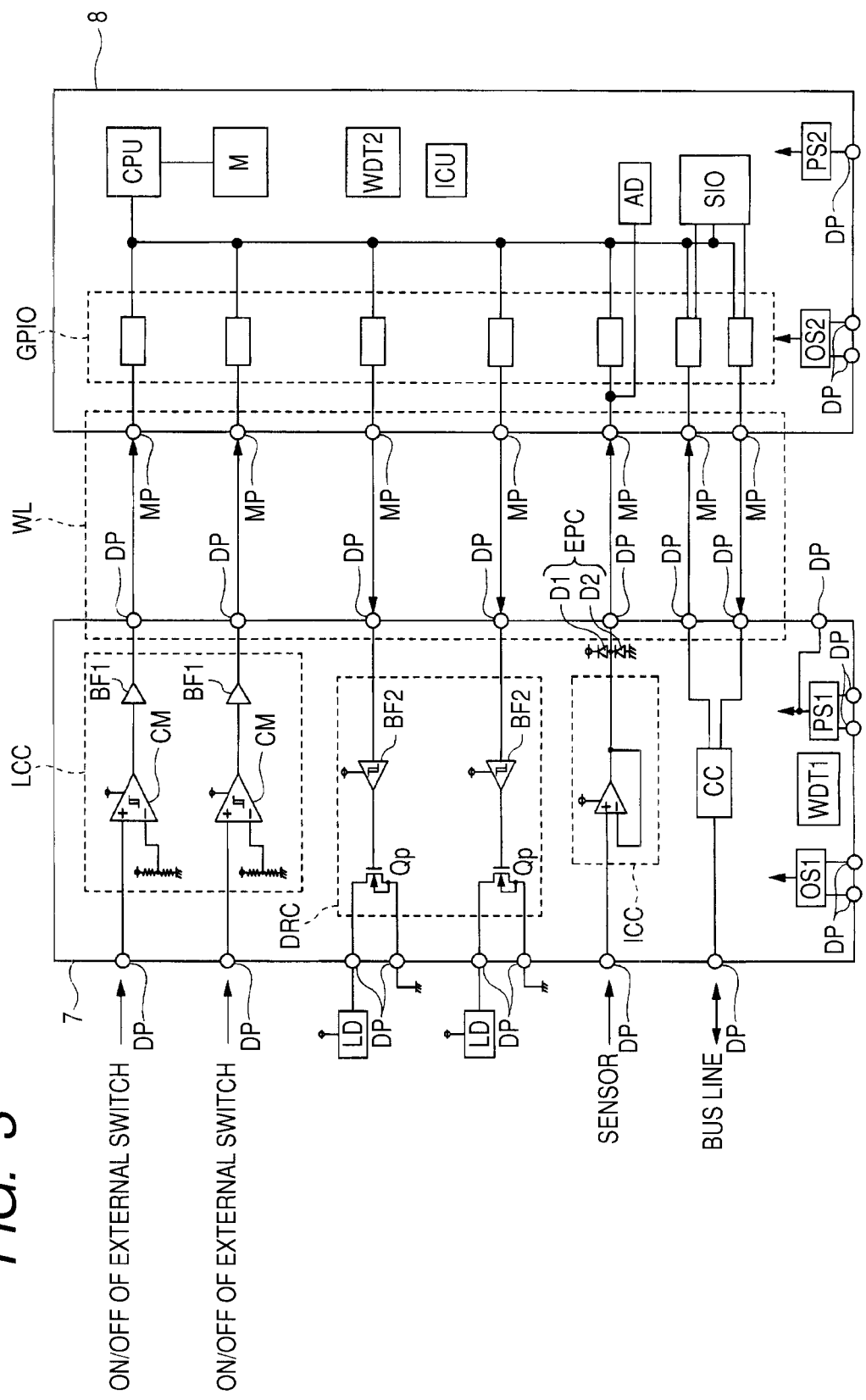
FIG. 3 is a circuit diagram of the semiconductor device of FIG. 1 and FIG. 2.

Next, an example of the circuit configuration of the semiconductor device 1 of the present embodiment will be described. FIG. 3 shows a circuit diagram of the semiconductor device 1 of the present embodiment.

The driver IC chip 7 includes a level converter circuit LCC, the above-described driver circuit (amplifier) DRC, an impedance conversion circuit ICC, a communication circuit CC, an oscillator OS1, a timer WDT1, and a power supply circuit PS1, and an electrostatic protection circuit EPC.

On the other hand, the microcomputer IC chip 8 includes a central processing unit CPU, a memory M, a general-purpose input/output port GPIO, a timer WDT2, an interruption control circuit ICU, an analog to digital conversion circuit AD, a serial input/output port SIO, an oscillator OS2, and a power supply circuit PS2.

First, the circuit of the driver IC chip 7 is described.

The level converter circuit LCC is a circuit for level-converting an input high voltage input to 5 V (or 3 V), for example, for output. The level converter circuit LCC includes a hysterisis comparator circuit CM1 and a buffer circuit BF1. The level converter circuit LCC is driven by turning on and off an external switch. Eventually, the level-converted output data is transmitted to the general-purpose input/output port GPIO of the 5-V (or 3-V) microcomputer IC chip 8.

The power supply system of the driver IC chip 7 handles input and output voltages of 6 to 80 V (of battery voltage system), for example, while the power supply system of the microcomputer IC chip 8 is the 5-V system, for example. For this reason, the level converter circuit LCC is formed in the driver IC chip 7 so as not allow the external battery voltage to be input to the microcomputer IC chip 8. The microcomputer IC chip 8 identifies High (H)/Low (L) of the level that is converted for the microcomputer IC chip 8, and thereby the microcomputer IC chip 8 can recognize the outside state.

The driver circuit DRC is a circuit that turns on/off an external load LD upon receipt of a driver on/off signal from the microcomputer IC chip 8. The driver circuit DRC includes a power MOSFET Qp and a buffer circuit BF2.

This driver circuit DRC handles high voltage and additionally handles a large current (about 50 mA to 10 A) as well. Large current is required for, for example, driving an electron device (external device) having a large input capacitance, or driving an actuator. Note that the operation (on/off) of the driver circuit DRC is controlled by the microcomputer IC chip 8.

The impedance conversion circuit ICC is a circuit (voltage follower) for impedance-converting a detection signal from a sensor. The impedance-converted output data is transmitted to an input port of the analog to digital conversion circuit AD of the microcomputer IC chip 8.

If the output of the sensor or the like is directly input to the microcomputer IC chip 8, the level may drop depending on the output impedance of the sensor, and thus in order to compensate this, the signal that is impedance-converted in the driver IC chip 7 is input to the microcomputer IC chip 8.

The communication circuit CC is a communication interface circuit between a high-voltage common bus line and the 5V microcomputer IC chip 8. The communication circuit CC includes a level converter circuit similar to the level converter circuit LCC, and a driver circuit for driving the bus line.

The oscillator OS1 is a circuit for supplying a clock signal to the internal circuits of the driver IC chip 7.

Moreover, the power supply circuit PS1 is a circuit that generates a 5V power supply used for the internal circuits of the driver IC chip 7 and microcomputer IC chip 8. In the driver IC chip 7, a stable power supply used for the microcomputer IC chip 8 is generated from a battery power supply.

Moreover, the timer WDT1 is a counter circuit that informs the system of certain time information based on an established clock signal.

Next, the circuit of the microcomputer IC chip 8 is described.

The central processing unit CPU is a control circuit that controls the operations of various kinds of peripheral circuits based on commands (data) stored in the memory M. The memory M is a memory circuit for storing various kinds of data, and includes a ROM (Read Only Memory), a RAM (Random Access Memory), and the respective peripheral circuits thereof (sense amplifier circuit, decoder circuit, or the like).

The general-purpose input/output port GPIO is a circuit that outputs data to the outside or receives data from the outside in accordance with the setting.

The timer WDT2 is a circuit that counts up/counts down the counter based on the established clock signal to change the signal waveform of the general-purpose input/output port GPIO or to generate an interruption.

The interruption control circuit ICU is a circuit that receives an interrupt signal from the various kinds of peripheral circuits to generate an interruption to the central processing unit CPU.

The analog to digital conversion circuit AD is a circuit for converting an analog input data to a digital value. The electrostatic protection circuit, although not illustrated, is electrically coupled to the wirings for electrically coupling the pads MP of the microcomputer IC chip 8 to the plurality of leads 4AL. This electrostatic protection circuit includes two diodes D1 and D2. The diode D1 is electrically coupled between the above-described wiring and a power supply on a higher potential side with the diode D1 being coupled in the reverse direction. The diode D2 is electrically coupled between the above-described wiring and a power supply on a lower potential (earth potential) side with the diode D2 being coupled in the reverse direction.

In the present embodiment, as described above, the electrostatic protection circuit is coupled to the wiring that electrically couples the pads MP to the plurality of leads 4AL, however, the electrostatic protection circuit is desirably not placed over the wiring as much as possible. This is because a current value higher than a current value essentially required for operating the circuit is required by the portion that a current runs through the electrostatic protection circuit. However, since the analog to digital conversion circuit AD has an operating voltage lower than that of the other circuits in the microcomputer IC chip 8, the analog to digital conversion circuit AD is more likely to make an incorrect decision under an influence of noise as compared with the other circuits and also has a low breakdown voltage against static electricity or the like. For this reason, the electrostatic protection circuit is required, but a small one is used so that the current running therethrough may be small, considering the above-described reasons.

Accordingly, as described above, the electrostatic protection circuit is also coupled to the wiring that electrically couples the pad MP of the microcomputer IC chip 8 to the corresponding lead 4AL (a first lead), however, for example, when a severer electrostatic-discharge test is conducted, the microcomputer IC chip 8 may not withstand an overvoltage or noise caused by the static electricity or the like only with this electrostatic protection circuit of the microcomputer IC chip 8.

Then, in the present embodiment, in order to ensure to protect the analog to digital conversion circuit AD of the microcomputer IC chip 8, as shown in FIG. 3, the electrostatic protection circuit EPC is formed also in the driver IC chip 7 and is coupled to the wiring that electrically couples the pad MP of the analog to digital conversion circuit AD of the microcomputer IC chip 8 to a desired lead 4AL (a first lead) among the plurality of leads 4AL. In this case, the electrostatic protection circuit EPC of the driver IC chip 7 having a higher breakdown voltage (the area thereof is also large) than that of the electrostatic protection circuit of the microcomputer IC chip 8 is used. This can block or reduce an overvoltage or noise due to static electricity or the like before the overvoltage or noise due to the static electricity or the like reaches the microcomputer IC chip 8.

The serial input/output port SIO is a circuit which, on the basis of a predetermined clock signal, outputs or conversely receives an established parallel signal from the general-purpose input/output port GPIO, bit by bit.

The oscillator OS2 is a circuit that supplies a clock signal to the internal circuits of the microcomputer IC chip 8. Moreover, the power supply circuit PS2 is a step-down circuit that generates, from a 5-V power supply input to the microcomputer IC chip 8, a 3.3-V power supply or a 1.8-V power supply used for the internal circuits of the microcomputer IC chip 8.

Figure 4:
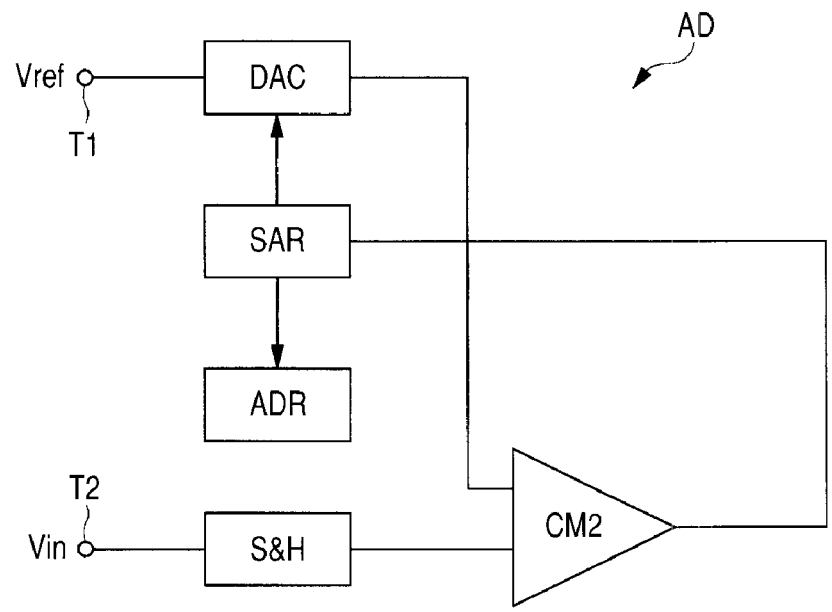
FIG. 4 is a circuit diagram of an example of an analog to digital conversion circuit often built in a second semiconductor chip of the semiconductor device of FIG. 1.

Next, FIG. 4 shows an example of the analog to digital conversion circuit AD often built into the microcomputer IC chip 8.

The analog to digital conversion circuit AD of FIG. 4 is, for example, a successive approximation type analog to digital converter, including a digital to analog conversion circuit DAC, a successive approximation register SAR, a result storing register ADR, a sample and hold circuit S&H, and a comparator CM2.

A terminal T1 to receive a reference input voltage Vref used for the digital to analog conversion circuit DAC of the analog to digital conversion circuit AD is electrically coupled to an input of the digital to analog conversion circuit DAC. An output of the digital to analog conversion circuit DAC is electrically coupled to one input of the comparator CM2.

On the other hand, a terminal T2 to receive an analog voltage Vin subjected to an analog-to-digital conversion is electrically coupled to an input of the sample and hold circuit S&H. An output of the sample and hold circuit S&H is electrically coupled to the other input of the comparator CM2.

An output of the comparator CM2 is electrically coupled to an input of the successive approximation register SAR. An output of the successive approximation register SAR is electrically coupled to the digital to analog conversion circuit DAC and the result storing register ADR.

Next, the operation of the successive approximation type analog to digital converter is described using FIG. 4.

The analog voltage Vin subjected to an analog-to-digital conversion is input to the comparator CM2. In the case where the sample and hold circuit S&H has a sample & hold function, a sampled analog voltage is input to the comparator CM2, while in the case where the sample and hold circuit S&H does not have the sample & hold function, the analog voltage Vin is input to the comparator CM2.

Although the successive approximation register SAR has the number of digits with the width of the bit accuracy of the analog to digital conversion circuit AD, in the case of an N bit successive approximation type analog to digital converter the register value of $2^{(N-2)}$ is set at first.

The digital to analog conversion circuit DAC inputs an analog voltage corresponding to the value of the successive approximation register SAR to the comparator CM2.

In determining to set the next digit of the successive approximation register SAR, when the comparator CM2 outputs a high (H) level, the resister value becomes the last register value of the successive approximation register SAR+$2^{(N-2)}$. On the other hand, when the comparator CM2 outputs a low (L) level, the resister value becomes the last register value of the successive approximation register SAR-$2^{(N-2)}$.

In the formula of $2^{(N-K)}$ of the register value, the portion of K increments by one for each repetition. The repetition completes at N=K. Thereafter, the repetition is performed three to four times until the last digit of the register value of the successive approximation register SAR is established. Upon determination of the last digit, the result is stored in the result storing register ADR, and the analog to digital conversion is completed.

In such an analog to digital conversion circuit AD, digitally controlled portions are the successive approximation register SAR and the result storing register ADR. Since these circuits handle high/low level signals and are driven with a relatively low impedance, these are less affected by noise. Moreover, these circuits are also strong to the heat generated in the driver circuit DRC of the driver IC chip 7 and have a small characteristic fluctuation.

In contrast thereto, analog circuits such as the digital to analog conversion circuit DAC, the sample and hold circuit S&H, and the comparator CM2 may affect the analog to digital conversion result when affected by heat and noise. Moreover, also when the terminals T1, T2 used for the analog voltage inputs, such as the reference input voltage Vref and the analog voltage Vin, are affected by the noise of the driver circuit DRC of the driver IC chip 7, the analog voltage to be input may vary to affect the analog to digital conversion result.

For example, the following incorrect decisions are enumerated.

When in the resistors or capacitors of the digital to analog conversion circuit DAC, the characteristic thereof locally varies due to the heat generation of the driver circuit DRC, the desired output value of the digital to analog conversion circuit DAC cannot be obtained. For this reason, a high/low output of the comparator CM2 is inverted to cause an incorrect setting of the successive approximation register SAR, resulting in an error in the analog to digital conversion result.

In the sample and hold circuit S&H, when a sampled voltage is affected by capacitively coupled noise of the driver circuit DRC, the sampled voltage may vary because it is difficult to bypass this noise. Then, a high/low output of the comparator CM2 is inverted to cause an incorrect setting of the successive approximation register SAR, resulting in an error in the analog to digital conversion result.

Then, in the present embodiment, the driver circuit DRC of the driver IC chip 7 is not placed directly under the analog to digital conversion circuit AD of the microcomputer IC chip 8. In particular, in the analog to digital conversion circuit AD, the driver circuit DRC of the driver IC chip 7 is not placed directly under the circuit blocks, such as the digital to analog conversion circuit DAC, the sample and hold circuit S&H, and the wirings and terminals related thereto, except the successive approximation register SAR and the result storing register ADR.

Figure 5:
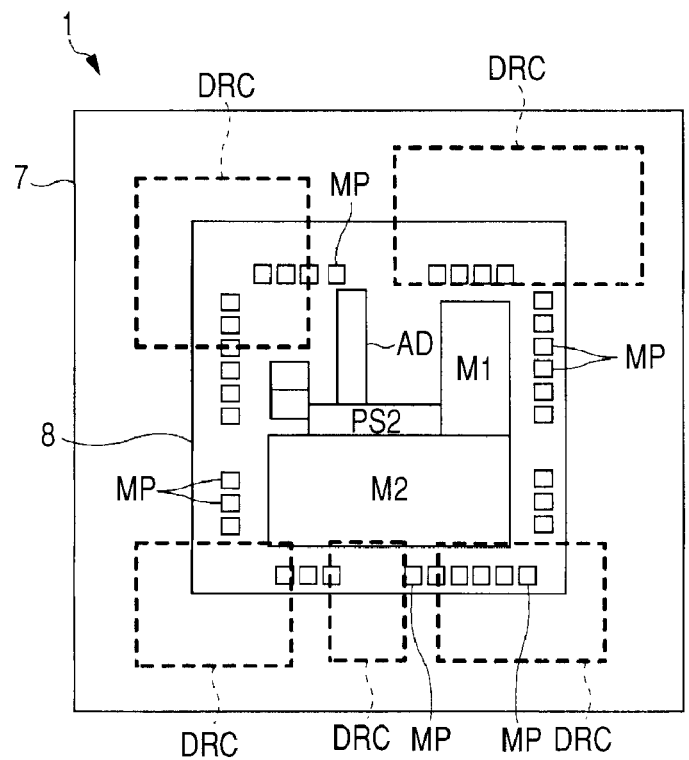
FIG. 5 is a plan view showing an example of a plane layout of a driver circuit of a first semiconductor chip and a circuit block of the second semiconductor chip of the semiconductor device of FIG. 1.
Figure 6:
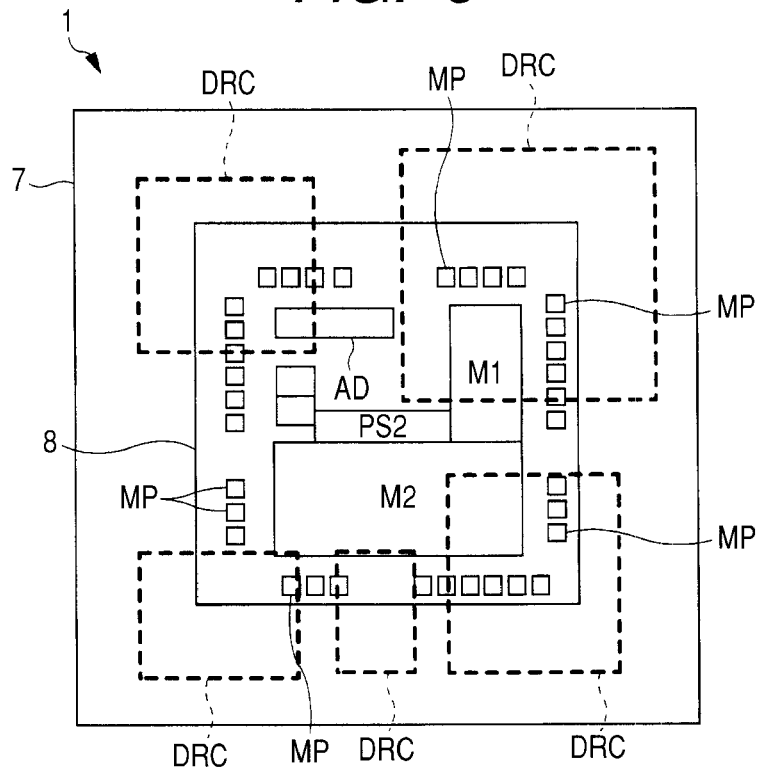
FIG. 6 is a plan view showing an example of a plane layout of the driver circuit of the first semiconductor chip and the circuit block of the second semiconductor chip of the semiconductor device of FIG. 1.

FIG. 5 and FIG. 6 are plan views showing examples of the plane arrangement of the driver circuit DRC of the driver IC chip 7 and the circuit blocks of the microcomputer IC chip 8.

Although other circuits besides the driver circuit DRC are arranged in the major surface of the driver IC chip 7, in the driver IC chip 7 of FIG. 5 and FIG. 6 other circuits are omitted for ease of viewing the drawings and only the driver circuit DRC is illustrated. The driver circuit DRC is placed at a location closer to the peripheral edge of the major surface of the driver IC chip 7 than to the center of the major surface thereof. This can shorten the distance between the driver circuit DRC and the above-described pad DP and can reduce the on resistance between the driver circuit DRC and the pad DP, so that the driving capability of the semiconductor device 1 can be improved.

RAM M1 and ROM M2 of the microcomputer IC chip 8 are circuit blocks constituting the memory M. Assume that the respective peripheral circuits (e.g., a sense amplifier or a decoder circuit) are also arranged in the regions of the RAM M1 and ROM M2.

In the case of SiP using the stacked packaging method for stacking the driver IC chip 7 and the microcomputer IC chip 8, there is concern that heat or noise of the lower-side driver IC chip 7 may affect the analog circuit blocks (including wirings and terminals, as well) of the upper-side microcomputer IC chip 8. Here are the reasons. One reason is that there is an induced electromotive force due to a parasitic inductance or a capacitively coupled noise due to a parasitic capacitance because the current handled by the driver circuit DRC of the driver IC chip 7 ranges from several hundred mA to several A and the voltage to be handled also swings from 0 to about 40 V (80 V). Another reason is that the driver circuit DRC of the driver IC chip 7 has a larger heat generation amount as compared with that of the microcomputer IC chip 8. Still another reason is that the analog circuit blocks, for example, such as the analog to digital conversion circuit AD, the digital to analog conversion circuit DAC, the sense amplifier for RAM M1 and ROM M2, and the power supply circuit PS2, are sensitive to heat or noise.

In the case of SiP using the above-described plain type packaging method, countermeasure is possible by increasing the distance between the analog circuit blocks (including wirings and terminals, as well) and the driver circuit DRC, or by shielding with a low impedance member, however, in the case of SiP using the stacked packaging method such a countermeasure is not available.

Then, in the present embodiment, as illustrated in FIG. 5 and FIG. 6, the microcomputer IC chip 8 is mounted over the driver IC chip 7 so that the analog circuit blocks (e.g., one or two or more circuits of the analog to digital conversion circuit AD, the digital to analog conversion circuit DAC, the sense amplifier circuits for RAM M1 and ROM M2, and the power supply circuit PS2) may not two-dimensionally overlap with the driver circuit DRC of the driver IC chip 7 (the distance therebetween may increase).

In particular, the operating voltage of the analog to digital conversion circuit AD of the microcomputer IC chip 8 is a value obtained by dividing the operating voltage by the number of bits, and the voltage value to be handled is lower than the other circuits and is sensitive to heat or noise, so that the analog to digital conversion circuit AD is preferably separated from the driver circuit DRC of the driver IC chip 7.

Moreover, from the viewpoint of the ease of die bonding, the respective semiconductor chips may be stacked with the center of the major surface of the microcomputer IC chip 8 being aligned with the center of the major surface of the driver IC chip 7. However, as described above, in order for the above-described analog circuit blocks of the microcomputer IC chip 8 not to two-dimensionally overlap with the driver circuit DRC of the driver IC chip 7, the respective semiconductor chips may be stacked with the center of the major surface of the microcomputer IC chip 8 being shifted from the center of the major surface of the driver IC chip 7.

In this way, the analog circuit blocks of the microcomputer IC chip 8 are prevented from two-dimensionally overlapping with the driver circuit DRC of the driver IC chip 7, and thereby it is possible to reduce the effect of heat or noise, which the analog circuit blocks of the microcomputer IC chip 8 receive from the driver circuit DRC of the lower-side driver IC chip 7 during the operation. Accordingly, the operation stability of the SiP (semiconductor device 1) using the stacked packaging method for stacking the microcomputer IC chip 8 over the driver IC chip 7 can be improved.

Therefore, the driver IC chip 7 and the microcomputer IC chip 8 can be stacked without causing a problem in terms of the operation of the semiconductor device 1. Accordingly, the semiconductor device 1 can be miniaturized as described above. Moreover, the flexibility in the layout of the wires WL can be increased, so that the circuit design of the semiconductor device 1 can be performed easily and also the yield and reliability of the semiconductor device 1 can be improved.

Next, the arrangement of external wirings (pads DP, MP, wires WL, and leads 4AL) of the driver IC chip 7 and microcomputer IC chip 8 is described.

Although the arrangement of the external wirings of the microcomputer IC chip 8 cannot be generalized because it depends on the relevant product, most of the external wirings are of a logic system and handle digital low level and high level. Accordingly, even if the external wiring used for the output of the driver circuit DRC of the driver IC chip 7 is arranged next to the logic-system external wiring of the microcomputer IC chip 8, this arrangement is less likely to cause a problem.

However, in the case of the microcomputer IC chip 8 including the analog to digital conversion circuit AD or digital to analog conversion circuit DAC of the microcomputer IC chip 8, attention should be put on the output voltage and output current of other external wirings adjacent to the external wiring for handling the signal of the analog to digital conversion circuit AD or the digital to analog conversion circuit DAC.

This is because if there is a voltage change with a very large amplitude and with a high slew rate in other external wiring adjacent to the external wiring related to the analog to digital conversion circuit AD or the digital to analog conversion circuit DAC, an error after the digital conversion may occur in the analog to digital conversion circuit AD and a fluctuation in the output analog level may occur in the digital to analog conversion circuit DAC. Accordingly, it should be avoided that an external wiring used for the output of the driver circuit DRC of the driver IC chip 7 is arranged next to the external wiring related to the analog to digital conversion circuit AD or the digital to analog conversion circuit DAC.

Figure 7:
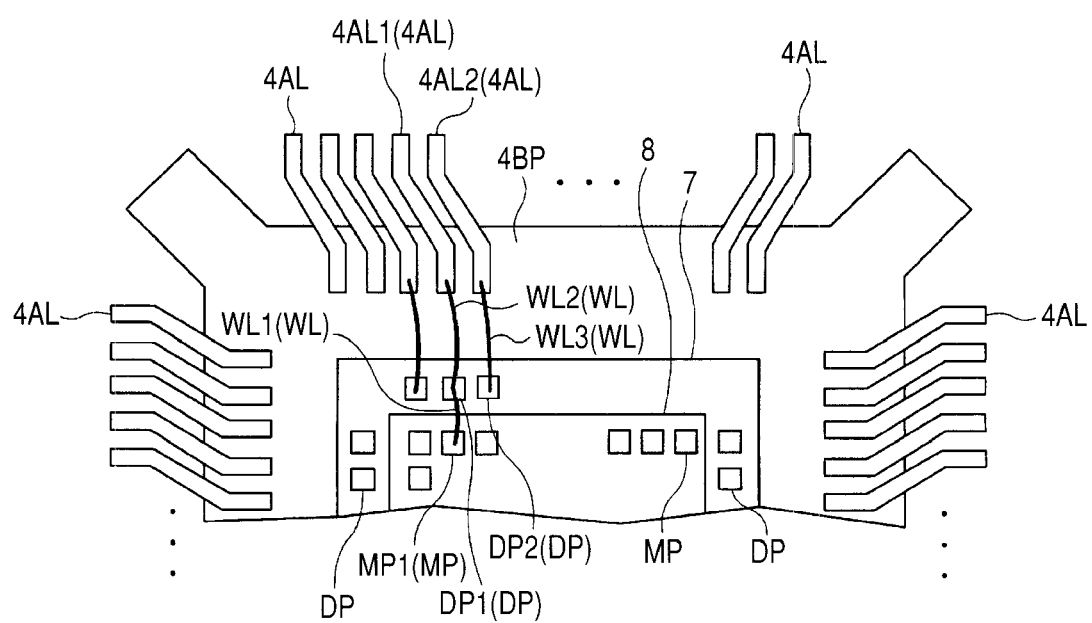
FIG. 7 is an enlarged plan view of a major part of a semiconductor device which the inventors studied.

FIG. 7 is an enlarged plan view of a major part of a semiconductor device the inventors studied. Note that, in FIG. 7, the package 2 is omitted for ease of viewing the drawing.

A pad MP1 (MP) used for the input of the analog to digital conversion circuit AD of the microcomputer IC chip 8 is electrically coupled to a dummy pad DP1 (DP) of the driver IC chip 7 via a wire WL1 (WL). This dummy pad DP1 is electrically coupled to a lead (a first lead) 4AL1 (4AL) used for the input of the analog to digital conversion circuit AD via a wire WL2 (WL). On the other hand, a pad DP2 (DP) used for the output of the driver circuit DRC of the driver IC chip 7 is electrically coupled to a lead (a second lead) 4AL2 (4AL) used for the output of the driver circuit DRC via a wire WL3 (WL).

Here, the pad MP1 used for the input of the analog to digital conversion circuit AD and the pad DP2 used for the output of the driver circuit DRC are arranged in the vicinity of a side facing the same direction of the respective semiconductor chips. Then, the pad DP2 used for the output of the driver circuit DRC is arranged next to the dummy pad DP1 to which the input of the analog to digital conversion circuit AD is electrically coupled. Moreover, the lead 4AL2 used for the output of the driver circuit DRC is arranged next to the lead 4AL1 used for the input of the analog to digital conversion circuit AD. Moreover, the wire WL3 used for the output of the driver circuit DRC is arranged next to the wire WL2 used for the input of the analog to digital conversion circuit AD.

In this way, in the example of FIG. 7, since the pad DP1, wire WL2, and lead 4AL1 used for the input of the analog to digital conversion circuit AD are adjacent to the pad DP2, the wire WL3, and the lead 4AL2 of the driver circuit DRC, respectively, the operation of the analog to digital conversion circuit AD may be affected by noise from the driver circuit DRC during the analog to digital conversion.

Figure 8:
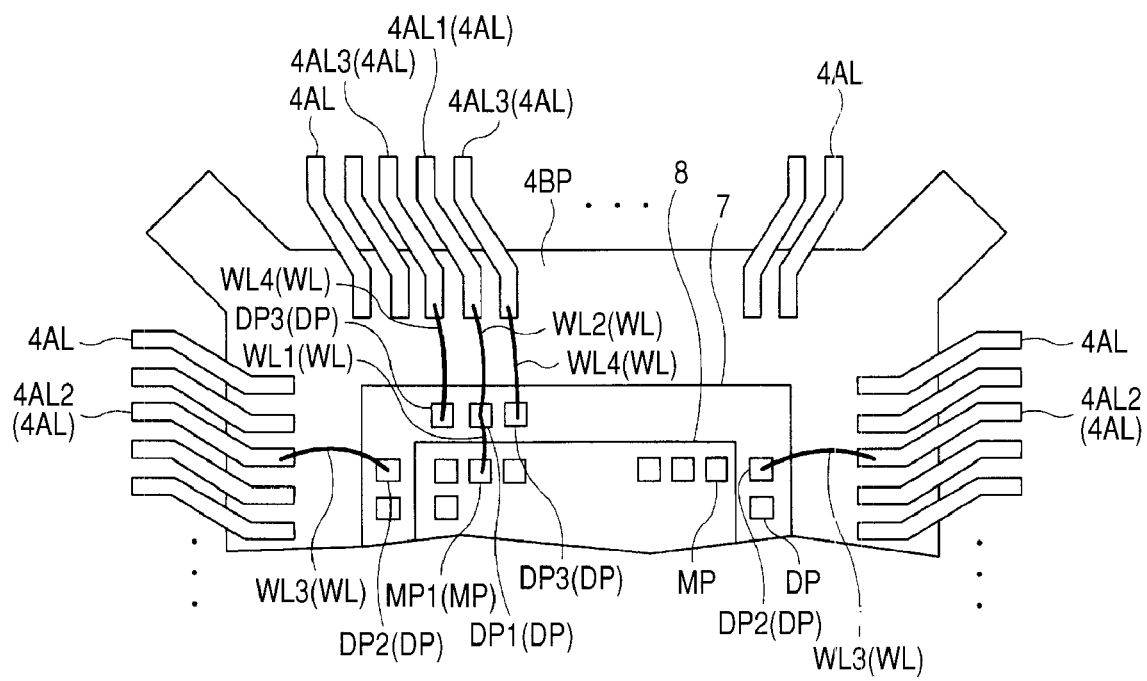
FIG. 8 is an enlarged plan view of a major part of the semiconductor device of FIG. 1.

Next, FIG. 8 is an enlarged plan view of a major part of the semiconductor device 1 of the present embodiment. In FIG. 8, the package 2 is omitted for ease of viewing the drawing.

The pad MP1, the DP1, wires WL1, WL2, and lead 4AL1 related to the input of the analog to digital conversion circuit AD of the microcomputer IC chip 8 are the same as those of FIG. 7.

The difference is in that the pad DP2, wire WL3, and lead 4AL2 used for the output of the driver circuit DRC of the driver IC chip 7 are spaced apart from the pad DP1, wires WL1, WL2, and lead 4AL1 used for the input of the analog to digital conversion circuit AD.

In particular, the pad MP1 used for the input of the analog to digital conversion circuit AD and the pad DP2 used for the output of the driver circuit DRC are arranged on the vicinity side of the sides, which are flipped by 90 degrees from each other and are facing different directions, of the respective semiconductor chips. Therefore, the lead 4AL1 and wire WL2 used for the input of the analog to digital conversion circuit AD are arranged so that the extending direction thereof may intersect with the extending direction of the lead 4AL2 and wire WL3 used for the output of the driver circuit DRC.

Such arrangement may reduce the effect of noise from the driver circuit DRC to the analog to digital conversion circuit AD during the analog to digital conversion. Accordingly, the operation stability of the semiconductor device 1 can be improved. Therefore, the driver IC chip 7 and the microcomputer IC chip 8 can be stacked without causing a problem in terms of the operation of the semiconductor device 1.

Moreover, in the present embodiment, a lead (a third lead) 4AL3 (4AL), to which a stable potential is supplied after startup, is arranged between the lead 4AL1 used for the input of the analog to digital conversion circuit AD of the microcomputer IC chip 8 and the lead 4AL2 used for the output of the driver circuit DRC of the driver IC chip 7.

This lead 4AL3 is, for example, a lead used for a reset signal, used for a chip select signal, or used for a power supply on the high potential side or a power supply on the low potential side (earth potential: 0 V, for example), and is arranged so as to sandwich the wire 4AL1 used for the input of the analog to digital conversion circuit AD of the microcomputer IC chip 8 therebetween.

This lead 4AL3 is electrically coupled to a pad DP3 via a wire WL4. This pad DP3 is adjacently arranged so as to sandwich the pad DP1 used for the input of the analog to digital conversion circuit AD therebetween. Moreover, the wire WL4 is adjacently arranged so as to sandwich the lead WL2 used for the input of the analog to digital conversion circuit AD therebetween.

Since such an arrangement may reduce a potential fluctuation around the lead 4AL1, wire WL2, and etc., used for the input of the analog to digital conversion circuit AD, the effect of noise from the outside to the analog to digital conversion circuit AD can be further reduced during the analog to digital conversion. Accordingly, the operation stability of the semiconductor device 1 can be improved. Therefore, the driver IC chip 7 and the microcomputer IC chip 8 can be stacked without causing a problem during the operation of the semiconductor device 1. Note that this structure is effective even when the pad MP1 used for the input of the analog to digital conversion circuit AD and the pad DP2 used for the output of the driver circuit DRC are arranged on the sides facing the same direction (see FIG. 7) of the respective semiconductor chips.

Next, a method for manufacturing the semiconductor device 1 of the present embodiment will be described.

Figure 9:
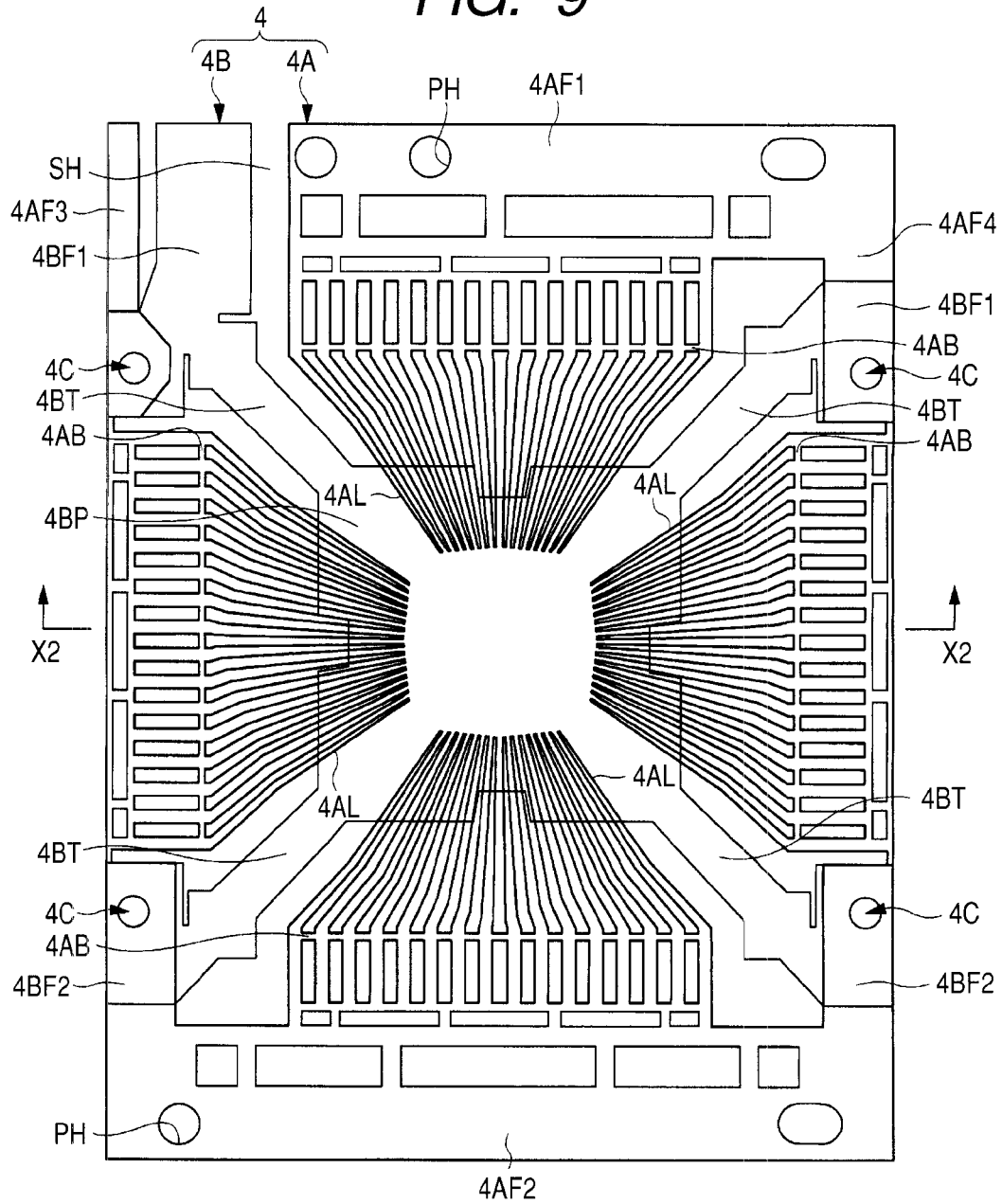
FIG. 9 is an enlarged plan view of a unit area of a leadframe.
Figure 10:
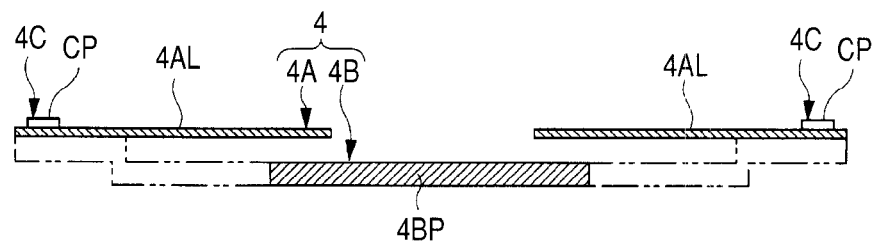
FIG. 10 is a cross sectional view along an X2-X2 line of the leadframe of FIG. 9.
Figure 11:
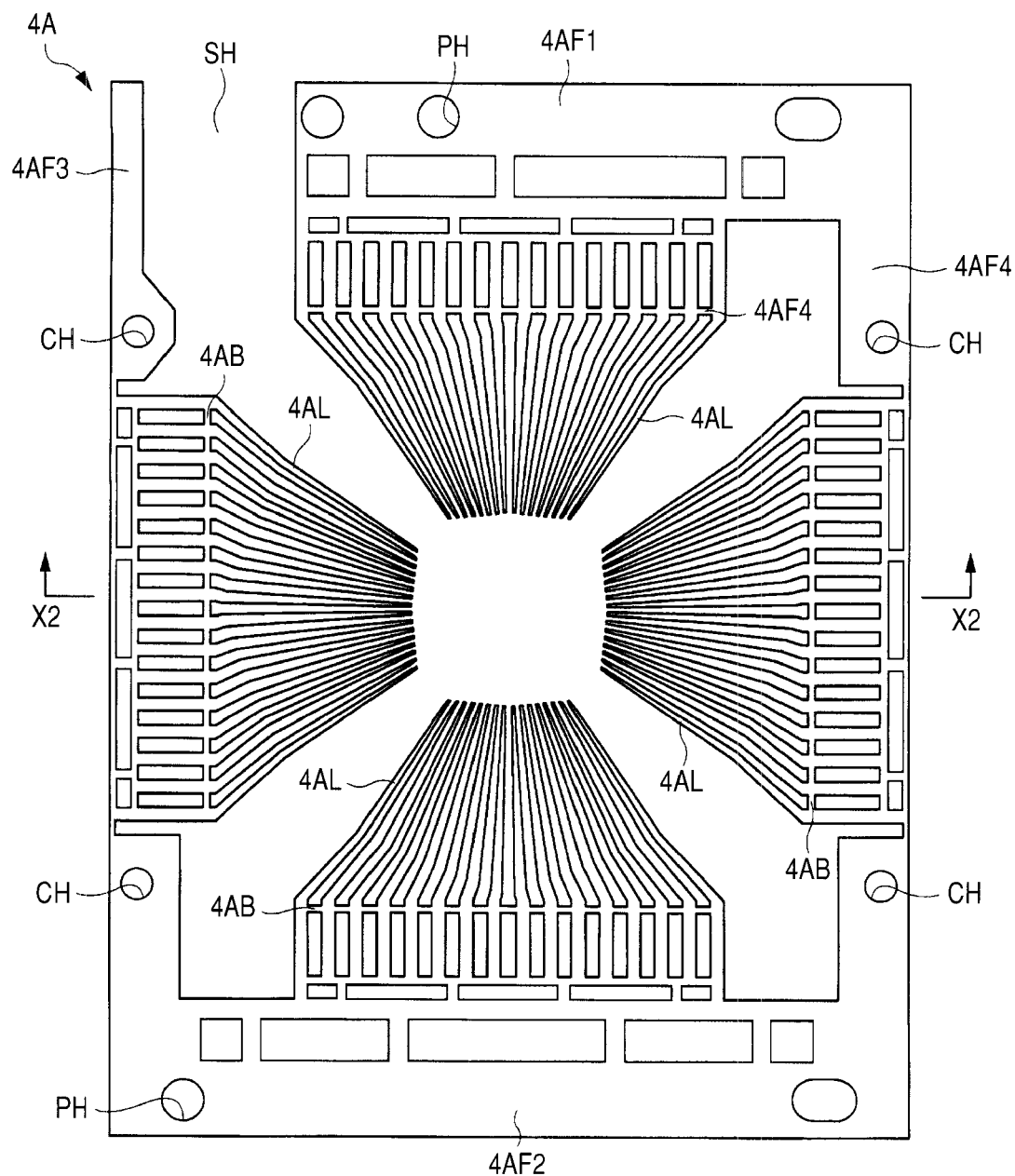
FIG. 11 is an enlarged plan view of a unit area of a lead structure of the leadframe of FIG. 9.
Figure 12:
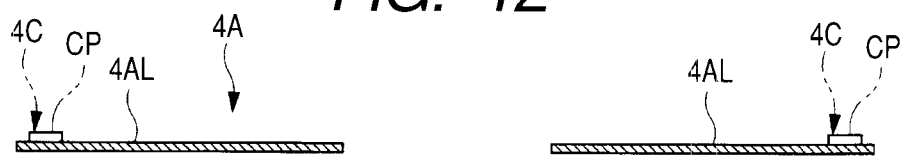
FIG. 12 is a cross sectional view along the X2-X2 line of the lead structure of FIG. 11.
Figure 13:
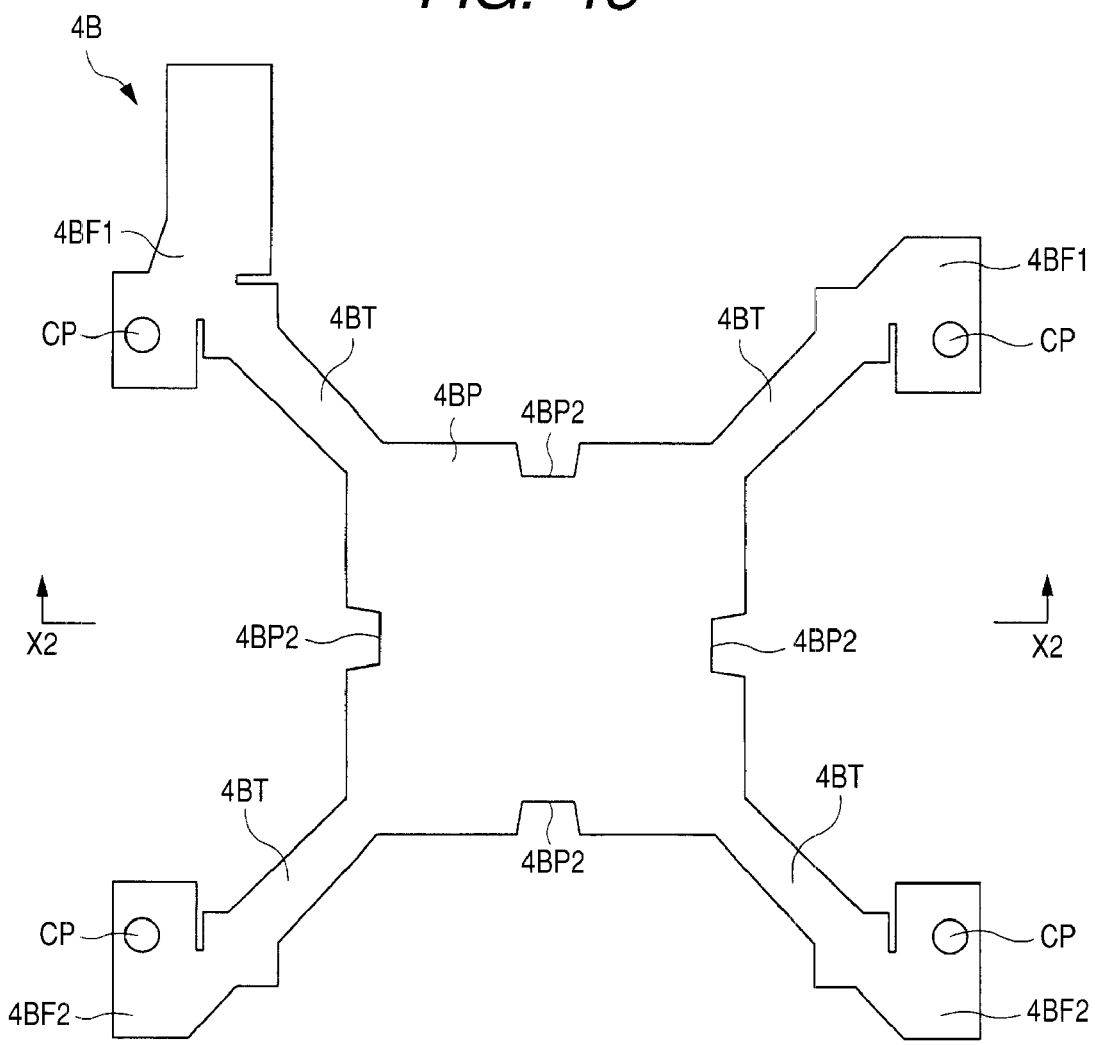
FIG. 13 is an enlarged plan view of a unit area of a heat sink structure of the leadframe of FIG. 9.
Figure 14:
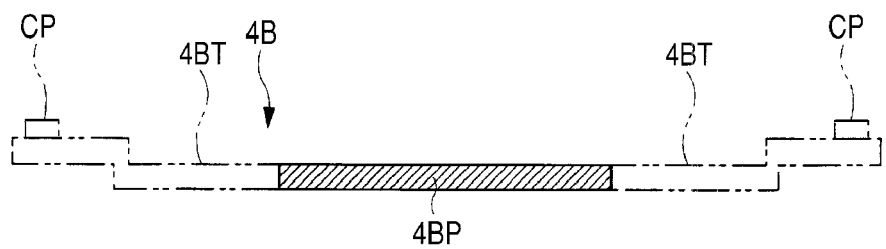
FIG. 14 is a cross sectional view along the X2-X2 line of the heat sink structure of FIG. 13.

First, a multiple leadframe 4 as shown in FIG. 9 to FIG. 14 is prepared. FIG. 9 is an enlarged plan view of a unit area of the leadframe 4, FIG. 10 is a cross sectional view along the X2-X2 line of the leadframe 4 of FIG. 9, FIG. 11 is an enlarged plan view of a unit area of a lead structure 4A, FIG. 12 is a cross sectional view along the X2-X2 line of the lead structure 4A of FIG. 11, FIG. 13 is an enlarged plan view of a unit area of a heat sink structure 4B, and FIG. 14 shows a cross sectional view along the X2-X2 line of the heat sink structure 4B of FIG. 13.

The unit area of the multiple leadframe 4 is an area having a constitution part required to manufacture one semiconductor device 1. In FIG. 9 to FIG. 14, only a unit area of the multiple leadframe 4 is shown, however, actually, this unit area is repeated and integrally arranged side by side along the horizontal direction of FIG. 9.

This multiple leadframe 4 comprises the lead structure 4A and the heat sink structure 4B. The lead structure 4A and the heat sink structure 4B are coupled to each other at a connection part 4C by means of a caulked joint.

The lead structure 4A and the heat sink structure 4B are formed by applying punch press process or applying etching process to a thin metal plate formed of a copper-based material (copper or a copper alloy), for example. Note that coating for appropriately implementing the wire WL is formed in the surface of the lead structure 4A by plating treatment using silver etc., for example.

The lead structure 4A has the major surface (a first major surface) and the rear surface (a second major surface) positioned on the opposite sides to each other along the thickness direction. The plurality of leads 4AL (inner lead portions and outer lead portions) are already integrally formed in this lead structure 4A. Each lead 4AL radially extends outward from the center of the unit area and is integrally coupled to outer frames 4AF1 to 4AF4. The leads 4AL adjacent to each other are connected to each other by a dambar 4AB that extends in the width direction of the leads 4AL at a position in the middle of the respective longitudinal directions.

A pilot hole PH is punched in the outer frames 4AF1, 4AF2. Moreover, an opening SH where a sub-runner of a package metal mold is arranged is formed at an intersection of the outer frames 4AF1, 4AF3. Moreover, four holes CH are formed in outer frames 4AF3, 4AF4.

On the other hand, the heat sink structure 4B has the major surface (a first major surface) and the rear surface (a second major surface) positioned on the opposite sides to each other along the thickness direction. The thickness of the heat sink structure 4B is thicker than the lead structure 4A.

The die pad 4BP is already integrally formed in this heat sink structure 4B. The plane size of the die pad 4BP is larger than that of the driver IC chip 7 and smaller than that of the package 2. In the major surface of this die pad 4BP, in a portion where the driver IC chip 7 is mounted, coating for appropriately implementing the bonding of the semiconductor chip is formed by plating treatment using silver etc., for example.

This die pad 4BP is integrally coupled and supported to the outer frames 4BF1, 4BF2 via suspensions 4BT extending outward from four corners of the die pad 4BP. In the major surface of these outer frames 4BF1, 4BF2, four convex parts CP are formed at a plane position corresponding to (coinciding with) the four holes CH. The connection part 4C is formed by caulking the head of the convex part CP while the convex part CP of the heat sink structure 4B is fit into the hole CH of the lead structure 4A.

Moreover, a part of the suspension 4BT is bent toward the thickness direction thereof so that the die pad 4BP may keep away from the rear surface of the lead structure 4A (plurality of leads 4AL). Accordingly, when the lead structure 4A and the heat sink structure 4B are bonded together at the connection part 4C, a part of the inner side tip (inner lead portion) of the plurality of leads 4AL overlaps with the die pad 4BP when seen from a plane view, however, a gap is formed between the plurality of leads 4AL and the die pad 4BP when seen from a side view.

Figure 15:
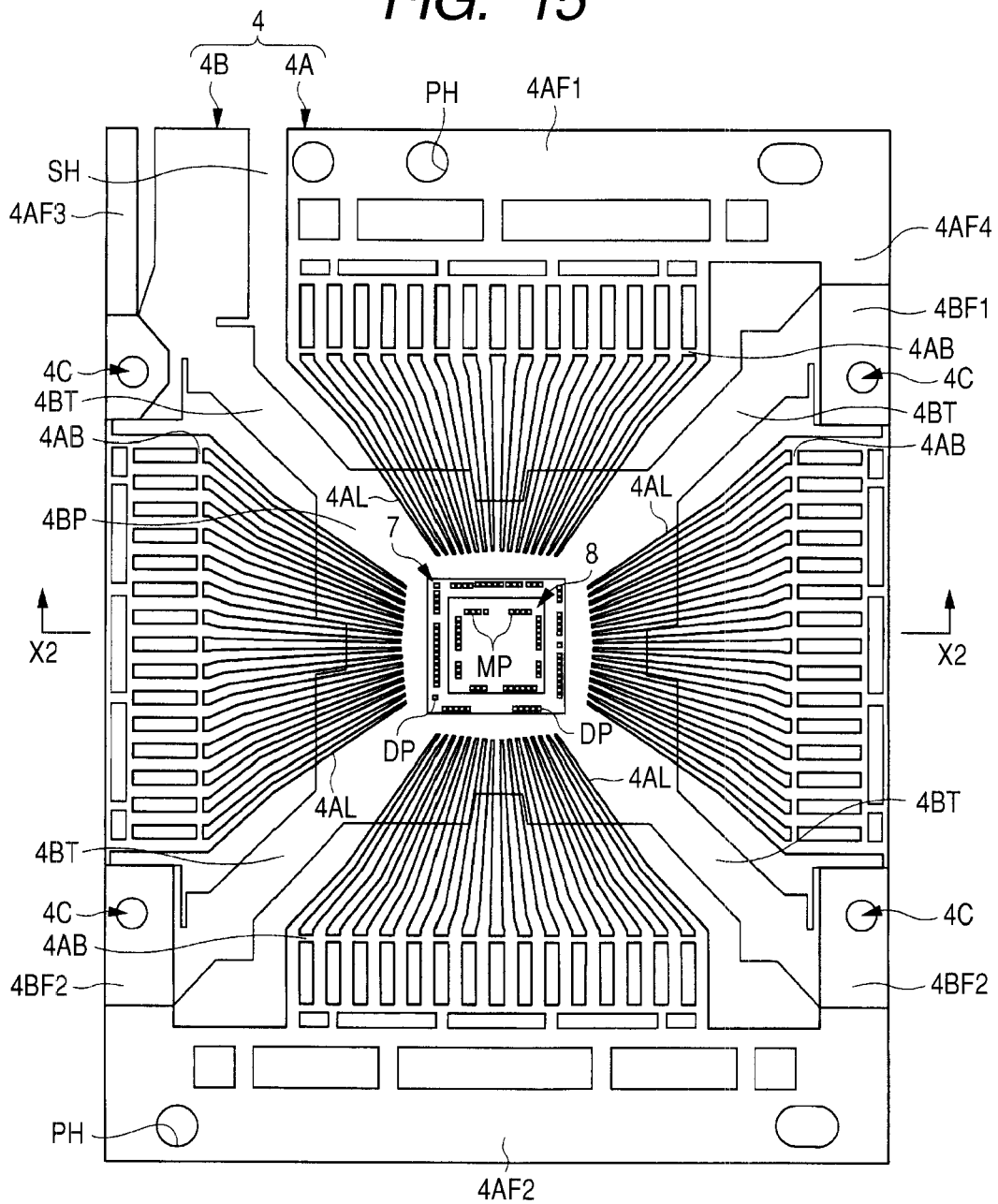
FIG. 15 is an enlarged plan view of the unit area of the leadframe following FIG. 9.
Figure 16:
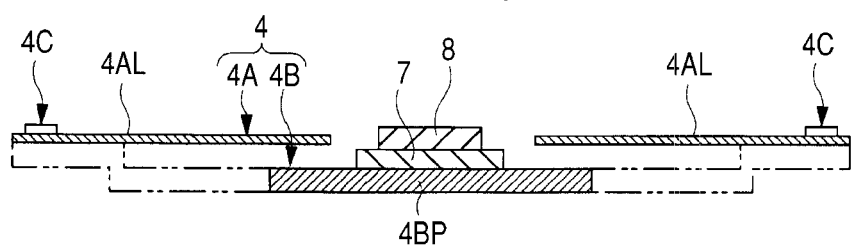
FIG. 16 is a cross sectional view along the X2-X2 line of the leadframe of FIG. 15.

Subsequently, as shown in FIG. 15 and FIG. 16, after the driver IC chip 7 is mounted over the major surface of the die pad 4BP of each unit area of the multiple leadframe 4, the microcomputer IC chip 8 is mounted over the major surface of this driver IC chip 7 (die bonding process). FIG. 15 is an enlarged plan view of the unit area of the leadframe 4 following FIG. 9, and FIG. 16 is a cross sectional view along the X2-X2 line of the leadframe 4 of FIG. 15.

As described above, the rear surface of the driver IC chip 7 is bonded to the major surface of the die pad 4BP via a lead-tin solder, for example. This can improve the radiation characteristic of the heat generated in the driver IC chip 7, as described above, and additionally the solder can absorb a mechanical stress acting between the driver IC chip 7 and the die pad 4BP because the solder provides flexibility.

Moreover, as described above, the rear surface of the microcomputer IC chip 8 is bonded to the major surface of the driver IC chip 7 via an insulating paste material or film (sheet), for example. Since this can make it difficult for the heat generated in the driver IC chip 7 to be conducted to the microcomputer IC chip 8, the operation stability of the semiconductor device 1 can be improved and furthermore the tilt control of the microcomputer IC chip 8 is also possible.

Figure 17:
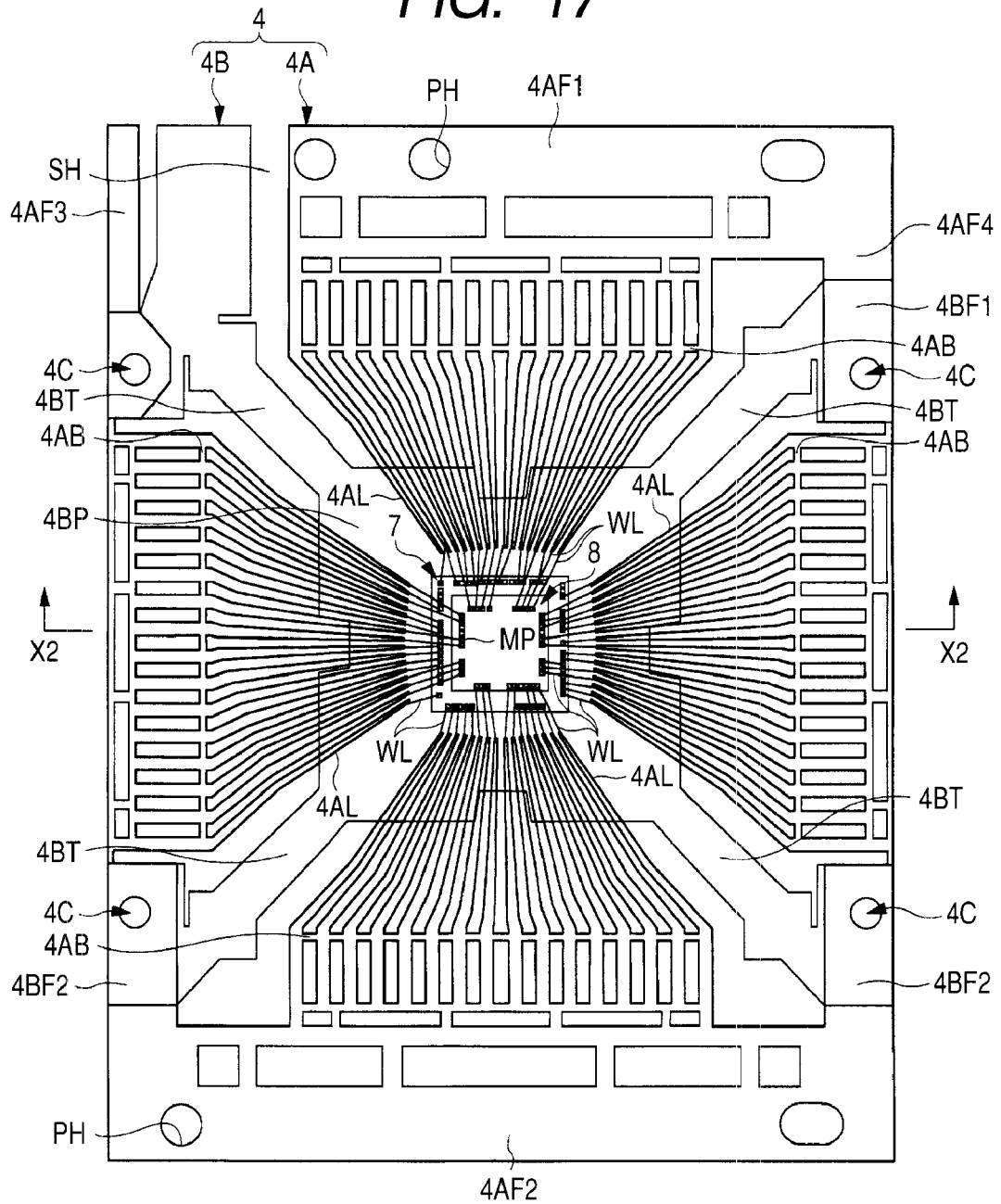
FIG. 17 is an enlarged plan view of the unit area of the leadframe following FIG. 15.
Figure 18:
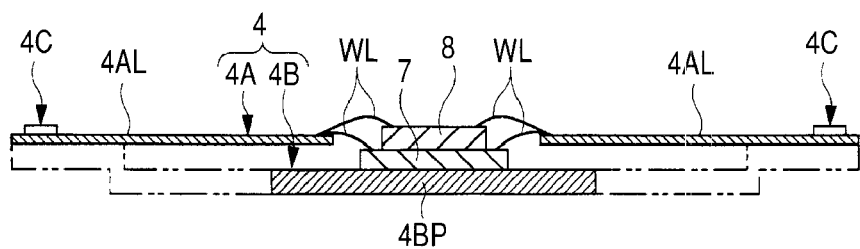
FIG. 18 is a cross sectional view along the X2-X2 line of the leadframe of FIG. 17.

Subsequently, as shown in FIG. 17 and FIG. 18, the pads DP of the driver IC chip 7 are electrically coupled to the plurality of leads 4AL by means of the wires WL, the pads MP of the microcomputer IC chip 8 are electrically coupled to the plurality of leads 4AL by means of the wires WL, and moreover, the pads DP of the driver IC chip 7 are electrically coupled to the pads MP of the microcomputer IC chip 8 by means of the wires WL. FIG. 17 is an enlarged plan view of the unit area of the leadframe 4 following FIG. 15, and FIG. 18 is a cross sectional view along the X2-X2 line of the leadframe 4 of FIG. 17.

Figure 19:
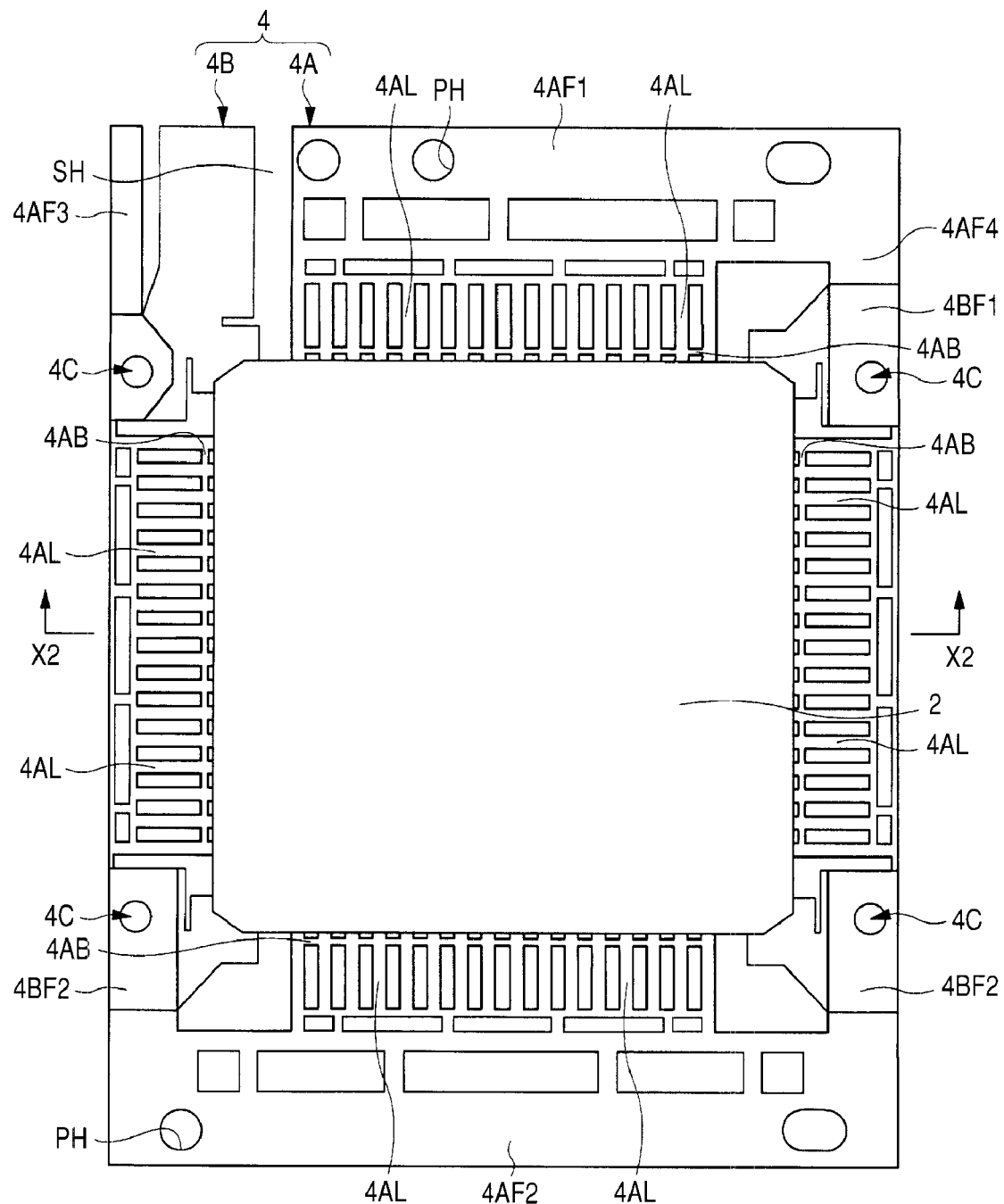
FIG. 19 is an enlarged plan view of the unit area of the leadframe following FIG. 17.
Figure 20:
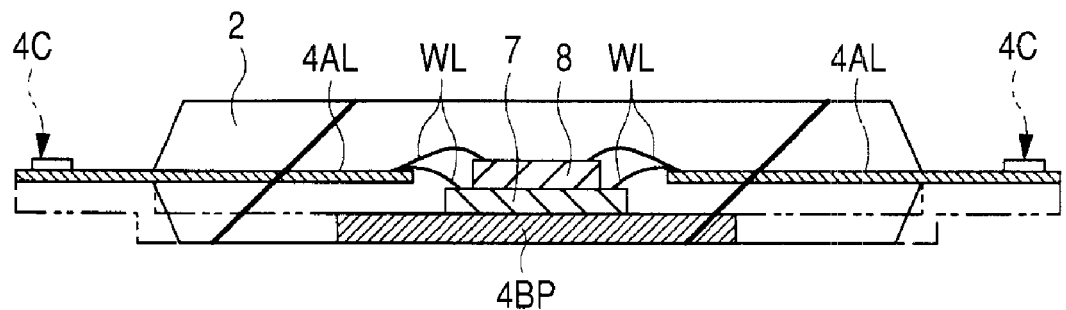
FIG. 20 is a cross sectional view along the X2-X2 line of the leadframe of FIG. 19.

Next, as shown in FIG. 19 and FIG. 20, the package 2 is formed by transfer molding. FIG. 19 is an enlarged plan view of the unit area of the leadframe 4 following FIG. 17, and FIG. 20 is a cross sectional view along the X2-X2 line of the leadframe 4 of FIG. 19. The package 2 is formed of thermosetting resin such as an epoxy resin, for example. In this molding process, the packages 2 in a plurality of unit areas of the leadframe 4 are collectively formed.

Then, after the individual package 2 is taken out from this leadframe 4 by cutting a part of the multiple leadframe 4, the plurality of leads 4AL (outer lead portion) projecting from the four side surfaces of the package 2 are formed in a gull wing shape to manufacture the semiconductor device 1.

As described above, although the present invention has been described specifically based on the embodiments, it is to be understood that the present invention is not limited to the above-described embodiments and various modifications may be made without departing from the scope of the present invention.

In the above description, the case where the invention is primarily applied to the power SiP for automotive use, which is a field of utilization constituting the background, but not limited thereto, and various applications are possible, and the present invention may be also applied to SiP used for a mobile phone, a digital camcorder, or a digital camera, for example.

The present invention is applicable to the manufacturing industries of semiconductor devices having a structure, in which a semiconductor chip including an amplifier and a semiconductor chip including a control circuit for controlling the operation of this amplifier are mixedly mounted inside a single sealing body with these chips being stacked.

What is claimed is:
1. A semiconductor device, comprising:
    (a) a chip mounting part;
    (b) a first semiconductor chip mounted over the chip mounting part,
    the first semiconductor chip having a first major surface,
    the first semiconductor chip including
        a driver circuit formed over the first major surface, and
        a plurality of pads arranged along a periphery of the first major surface;
    (c) a second semiconductor chip mounted over the first major surface of the first semiconductor chip,
    the second semiconductor chip having a second major surface,
    the second semiconductor chip including an analog circuit block formed over the second major surface,
    the analog circuit block including a plurality of circuits,
    the plurality of circuits of the analog circuit block including an analog to digital conversion circuit, and
    wherein an operating voltage of the analog to digital conversion circuit is lower than that of other circuits of the second semiconductor chip,
    (d) a plurality of leads electrically coupled to the first semiconductor chip and the second semiconductor chip; and
    (e) a sealing body sealing the first semiconductor chip, the second semiconductor chip, and a part of each of the plurality of leads,
    wherein the driver circuit of the first semiconductor chip is arranged at a location closer to a periphery edge than to a center of the first major surface of the first semiconductor chip, and
    wherein the second semiconductor chip is mounted over the first major surface of the first semiconductor chip so that the second semiconductor chip overlaps with the driver circuit of the first semiconductor chip, and the analog to digital conversion circuit of the second semiconductor chip does not overlap with the driver circuit of the first semiconductor chip in plan view.
2. The semiconductor device according to claim 1,
    wherein a heat generation amount during the operation of the first semiconductor chip is higher than that during the operation of the second semiconductor chip.
3. The semiconductor device according to claim 1,
    wherein the first semiconductor chip is mounted over the chip mounting part via a first material,
    wherein the second semiconductor chip is mounted over the first major surface of the first semiconductor chip via a second material, and
    wherein a thermal conductivity of the first material is higher than a thermal conductivity of the second material.
4. The semiconductor device according to claim 3,
    wherein the first material is a solder, and the second material is an insulating paste or an insulating film.
5. The semiconductor device according to claim 1,
    wherein the plurality of circuits of the analog circuit block further includes a control circuit for controlling an operation of the driver circuit, a digital to analog conversion circuit, a sense amplifier circuit, and a power supply circuit.
6. The semiconductor device according to claim 5,
    wherein among the plurality of leads, between a first lead electrically coupled to an external terminal of the analog to digital conversion circuit or the digital to analog con- version circuit of the second semiconductor chip and a second lead electrically coupled to an external terminal of the driver circuit of the first semiconductor chip, a third lead electrically coupled to any one of an external terminal used for a reset signal, an external terminal used for a chip select signal, an external terminal used for a power supply, and an external terminal used for ground is arranged.

7. The semiconductor device according to claim 1, wherein the second semiconductor chip is arranged with a center thereof being shifted from a center of the first semiconductor chip.

8. The semiconductor device according to claim 1, wherein an external terminal of the analog to digital conversion circuit of the second semiconductor chip and an external terminal of the driver circuit of the first semiconductor chip are arranged on sides facing in mutually different directions of the first and second semiconductor chips.

9. The semiconductor device according to claim 8, wherein the external terminal of the analog to digital conversion circuit of the second semiconductor chip is electrically coupled to a first lead among the plurality of leads via an external terminal of the first semiconductor chip.

10. The semiconductor device according to claim 8, wherein an electrostatic protection circuit formed in the first semiconductor chip is electrically coupled to a wiring that electrically couples the external terminal of the analog to digital conversion circuit of the second semiconductor chip to a first lead among the plurality of leads.

11. The semiconductor device according to claim 1, wherein a portion of the chip mounting part is covered with the sealing body, and another portion of the chip mounting part is exposed from the sealing body.

12. The semiconductor device according to claim 1, wherein a height of a mounting surface of the sealing body is the same as or higher than that of a mounting surface of the plurality of leads exposed from the sealing body.

13. The semiconductor device according to claim 1, wherein the second semiconductor chip further comprises:
a RAM formed over the second major surface of the second semiconductor chip; and
a ROM formed over the second major surface of the second semiconductor chip,
wherein the RAM and the ROM do not overlap with the driver circuit of the first semiconductor chip.

14. The semiconductor device according to claim 1, wherein the driver circuit of the first semiconductor chip is disposed at a location closer to a peripheral edge of the major surface of the first semiconductor chip than to the center of the major surface thereof.

15. A semiconductor device, comprising:
(a) a chip mounting part;
(b) a first semiconductor chip mounted over the chip mounting part,
the first semiconductor chip having a first major surface,
the first semiconductor chip including
a driver circuit formed over the first major surface, and
a plurality of pads arranged along a periphery of the first major surface;
(c) a second semiconductor chip mounted over the first major surface of the first semiconductor chip,
the second semiconductor chip having a second major surface,
the second semiconductor chip including an analog circuit block formed over the second major surface,
the analog circuit block including a plurality of circuits,
the plurality of circuits of the analog circuit block including an analog to digital conversion circuit, and
wherein an operating voltage of the analog to digital conversion circuit is lower than that of other circuits of the second semiconductor chip,
(d) a plurality of leads electrically coupled to the first semiconductor chip and the second semiconductor chip; and
(e) a sealing body sealing the first semiconductor chip, the second semiconductor chip, and a part of each of the plurality of leads,
wherein the driver circuit of the first semiconductor chip is arranged at a location closer to a periphery edge than to a center of the first major surface of the first semiconductor chip, and
wherein the second semiconductor chip is mounted over the first major surface of the first semiconductor chip so that the second semiconductor chip overlaps with the driver circuit of the first semiconductor chip, and a distance between the analog to digital conversion circuit of the second semiconductor chip and the driver circuit of the first semiconductor chip is larger than a distance between the analog to digital conversion circuit of the second semiconductor chip and the driver circuit of the first semiconductor chip if the first and second semiconductor chips were entirely overlapping.

16. The semiconductor device according to claim 15, wherein an area which the analog to digital conversion circuit overlaps with the driver circuit of the first semiconductor chip is smaller than an area which the analog to digital conversion circuit does not overlap with the driver circuit of the first semiconductor chip in the analog to digital conversion circuit.

* * * * *